US007000164B2

(12) United States Patent
Siegel et al.

(10) Patent No.: US 7,000,164 B2
(45) Date of Patent: Feb. 14, 2006

(54) METHOD FOR SCAN TESTING AND CLOCKING DYNAMIC DOMINO CIRCUITS IN VLSI SYSTEMS USING LEVEL SENSITIVE LATCHES AND EDGE TRIGGERED FLIP FLOPS

(75) Inventors: Joseph R. Siegel, Shrewsbury, MA (US); David J. Greenhill, Portola Valley, CA (US); Ban-Pak Wong, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 485 days.

(21) Appl. No.: 10/060,179

(22) Filed: Jan. 30, 2002

(65) Prior Publication Data

US 2003/0145264 A1 Jul. 31, 2003

(51) Int. Cl.
*G01R 31/28* (2006.01)
*H04L 7/00* (2006.01)

(52) U.S. Cl. .................................. 714/731; 713/400

(58) Field of Classification Search ................ 714/729, 714/726, 731, 744, 798, 811, 815; 713/500, 713/400

See application file for complete search history.

(56) References Cited

U.S. PATENT DOCUMENTS

| | | | | |
|---|---|---|---|---|
| 6,452,426 | B1 * | 9/2002 | Tamarapalli et al. | 327/99 |
| 6,763,489 | B1 * | 7/2004 | Nadeau-Dostie et al. | 714/731 |
| 2003/0084390 | A1 * | 5/2003 | Tamarapalli et al. | 714/744 |
| 2003/0106003 | A1 * | 6/2003 | Whetsel | 714/729 |

OTHER PUBLICATIONS

Abramovici, M. et al. "Design for testability" in *Digital systems testing and testable design*, 368-381 (1990).

* cited by examiner

*Primary Examiner*—Christine T. Tu
(74) *Attorney, Agent, or Firm*—Lahive & Cockfield, LLP

(57) ABSTRACT

A system and method is provided for scan control and observation of a logical circuit that does not halt the operation of the system clock. Thus, all dynamic circuits within the system continue to evaluate and precharge normally. Moreover, the traditional method of placing a multiplexer before the data input of a clocked storage element to perform scan control and observation is no longer required. Consequently, the system and method provide a more efficient manner in which to perform scan control and observation of a logical circuit.

34 Claims, 12 Drawing Sheets

METHOD FOR SCAN TESTING AND CLOCKING DYNAMIC DOMINO CIRCUITS IN VLSI SYSTEMS USING LEVEL SENSITIVE LATCHES AND EDGE TRIGGERED FLIP FLOPS

TECHNICAL FIELD OF THE INVENTION

The present invention generally relates to an integrated electronic system, and more particularly, to clock signal generation for operation of the integrated electronic system.

BACKGROUND OF THE INVENTION

The clocked storage element, a level sensitive latch or an edge triggered flip-flop, are used to partition nearly every pipeline stage of a modem microprocessor. Clocked storage elements are utilized in this manner because they hold the current state of a pipeline stage and prevent the next state from entering the pipeline stage until scheduled to do so. Consequently, the clocked storage element synchronizes events between concurrent logic elements with different operational delays. As such, the design of a clocked storage element is tightly coupled to the clocking strategy and circuit topology of the system architecture.

In synchronous sequential circuits, switching events in various stages of the pipeline take place concurrently in response to a clock stimulus. New sets of inputs to the pipeline stages are sampled by the clocked storage elements and new computations are produced that change the state of the sequential network. Once complete, the results of the computations await the next clock transition to advance to next pipeline stage. Hence, any deviation in the clock period affects cycle time and performance of the microprocessor. Moreover, deviation in the clock period can create race conditions that cause the next state of a pipeline stage to race into a clocked storage element and corrupt its current state.

Given the difficulty of globally distributing multiple wire non-overlapping clocks, the generation and distribution of a single wire global clock is the current trend in microprocessor design. As such, scan testing of electronic systems that combine edge triggered flip-flops and level sensitive latches on a two phase single wire clock presents several problems with respect to system clocking, scan test clocking and clock control. The current scan test systems that fall into two general categories. The first category is known as "MuxScan" and employs edge triggered storage elements with a multiplexer coupled to the inputs of the storage elements to select between non-scan data and scan data. The second category typically employs level sensitive scan design (LSSD) whereby a multiplexer is coupled to the input of the level sensitive storage device to select between non-scan data and scan data.

LSSD scan testing typically utilizes two separate clocks that are non-overlapping to clock scan data into level sensitive latches. In comparison, MuxScan testing utilizes one clock, the system clock, along with a scan enable control signal, since data is sampled on a clock edge. Unfortunately, both techniques include a scan select multiplexer in the data path of the clocked storage element that increases data latency through a pipeline stage, thereby reducing the performance characteristics of the electronic design.

In addition, the two scan techniques described above typically require their main system clock to stop while shifting scan data into and out of the scannable electronic assembly. Consequently, scan techniques, such as sequential scan testing at system clock speed, critical path testing of functional test vectors at full system clock speed is problematic because the system clock is not allowed to run without interruption. An additional shortcoming of the two conventional systems for performing scan testing is that each system is generally adapted for use with only one type of clocked storage element. For example, the MuxScan system is usually adapted for use with edge triggered flip-flops while the LSSD scan system is usually adapted for use with a level sensitive latch. Unfortunately, it is desirable to make use of both latches and flip-flops in the same system or data pipeline that are correspondingly driven via the same single wire clock to define the timing characteristics of a data pipeline.

Furthermore, the two traditional systems for scan testing level sensitive latches (LSSD) and edge triggered flip-flops (MuxScan) do not lend themselves for use with dynamic logic circuits. This is especially true when the system clock is required to stop during the scan chain shifting process. Unfortunately, a dynamic logic circuit is designed to evaluate via a self timed path driven from one edge of the system clock. This explains why in the two conventional scan systems of performing scan control and observation, the clock to the clocked storage element is typically halted prior to the scan cycle evaluation. Moreover, halting of the main system clock allows only dynamic circuits in one clock phase to evaluate correctly. This is because circuits in the opposite clock phase must be pre-charged prior to evaluation in order to produce the correct logic value. As such, the use of one or both of the conventional scan systems provides an undue burden to scan testing very large scale integration (VLSI) circuits, such as a microprocessor. Furthermore, halting of the system clock causes undesirable current transients on the power system of the VLSI design that can cause significant damage to current sensitive devices within the VLSI design.

SUMMARY OF THE INVENTION

The present invention addresses the above-described limitations of conventional scan testing systems. Specifically, the present invention overcomes these problems by providing a system and a method for scan testing both level sensitive latches and edge triggered flip-flops. Consequently, the inherent performance drawbacks commonly associated with the conventional scan testing of clocked storage elements are no longer realized.

In one embodiment of the present invention, a system is provided for the performance of the scan control and observation of a circuit without having to stop the system clock. The system includes a clock control circuit, synchronized by the system clock. The clock control circuit controls when scan control and observation of the circuit occurs. The system also includes a system controller that provides the clock control circuit with the control signals needed to generate the various clock signals for the scan control and observation of the circuit. The clock control circuit includes several clock generators that generate the clock signals required by the circuit to perform its logical function along with the scan clocks necessary to shift scan data into and out of the circuit. The clock control circuit also includes a control circuit to enable and disable each clock generator in the clock control circuit.

The above described approach benefits a VLSI design that utilizes both level sensitive latches and edge triggered flip-flops, because a multiplexer device is no longer required to be coupled to the input of each clocked storage element utilized to perform scan control and observation. Moreover, the system clock runs continuously to avoid problems associated with stopping the system clock, such as current transients and precharging of dynamic circuits. As a result, fault coverage of a VLSI design can be significantly increased while significantly reducing the complexity of the scan control and observation system itself.

In accordance with another aspect of the present invention, a method is performed in an electronic system to scan test a logical circuit having a scan data path and a non-scan data path. The electronic system is provided with a system clock that runs without interruption during the performance of the scan testing of the logical circuit. During scan data shifting, the method halts data on the non-scan data path of the logical circuit to prevent data corruption during loading of the scan data into the logical circuit. Once non-scan data is halted on the non-scan data path, scan data is shifted over the scan data path into the logical circuit. Accordingly, the logical circuit evaluates the scan data during the appropriate phase of the system clock to determine an internal state of the logical circuit. When evaluation of the scan data is complete by the logical circuit the scan data is shifted out of the logical circuit over the scan data path for further evaluation by the electronic system. At this point, the non-scan data path is enabled to allow non-scan data to propagate along the non-scan data path and allow the logical circuit to evaluate the non-scan data.

The above-described approach benefits a microprocessor architecture that utilizes dynamic clocked storage elements to store data. As a result, dynamic circuits operating in different phases of the clock are able to preserve state when scan test and observation is initiated. Hence, all dynamic circuits within a VLSI architecture are able to precharge and evaluate correctly when scan control and observation is occurring. Moreover, power consumption of the microprocessor can be significantly reduced during scan test and observation because only one half of the circuitry in the microprocessor is allowed to transition.

According to another aspect of the present invention, a method is practiced for scan control and observation of an electronic system having a scannable electronic circuit. The method generates a system clock for the electronic system that runs continually during scan control and observation of the electronic system. The method controls operation of the electronic system in synchronicity with the system clock to determine an internal state of the electronic circuit of the electronic system. The method controls operation of the electronic system by generating a first clock signal that controls logical operation of the electronic circuit along with a second clock signal and a third clock signal to shift scan data into and out of the scannable electronic circuit. The method also selects when the scannable electronic circuit is in a scan state and when it is not by asserting or deasserting the appropriate control signal.

The above-described approach enables use of edge triggered flip-flops and level sensitive latches driven from a common single wire clock to perform scan testing thereon without impacting the speed and efficiency of storing data in a dynamic clocked storage element of a VLSI design. Accordingly, real time testing using various scan techniques is possible. Furthermore, because real time scan testing occurs without stopping the system clock, large current transients typically associated with stopping and restarting the system clock are eliminated.

BRIEF DESCRIPTION OF THE DRAWINGS

An illustrative embodiment of the present invention will be described below relative to the following drawings, in which like reference characters refer to the same parts throughout the different views. The drawings illustrate the principles of the invention and are not drawn to scale.

DETAILED DESCRIPTION OF AN ILLUSTRATIVE EMBODIMENT

Figure 1:
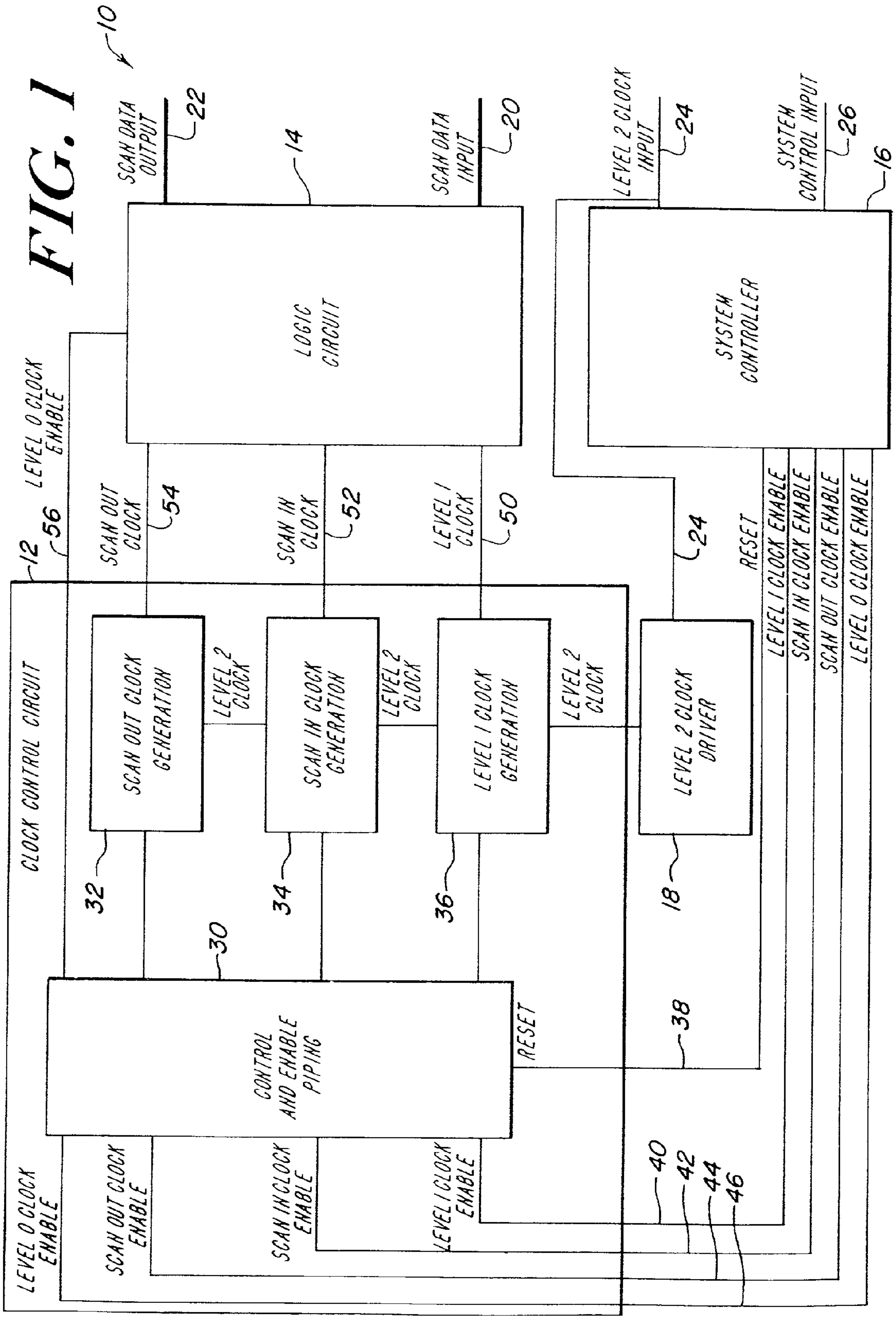
FIG. 1 depicts a block diagram of an electronic system suitable for practicing the illustrative embodiment of the present invention.

The illustrative embodiment of the present invention provides a system for performing scan control and observation on any type of clocked storage element without halting the system clock. In the illustrative embodiment, the clock control circuit is adapted to generate the clocks necessary to shift scan data into and out of a scannable logic element and to generate the clock necessary for the scannable logic element to properly operate. Each clock generator of the clock control circuit is coupled to a system controller that provides the control signals to initiate and halt generation of the various clocks. In addition, each clock generator is coupled to the system clock to synchronize clock generation in each clock generator. Hereinafter, the system clock is referred to as the level 2 clock. Nevertheless, those skilled in the art will appreciate that the level 2 clock is a low skew single wire two phase clock distributed throughout the system of the illustrative embodiment of the present invention. The level 2 clock runs continuously throughout the system even during scan control and observation of a scannable logic element, such as a clocked storage element.

In the illustrative embodiment, the system is attractive for use in VLSI designs, such as microprocessors that wish to increase on chip fault coverage without slowing performance in terms of the speed at which of the VLSI design evaluates data. This system allows level sensitive latches and edge triggered flip-flops, both dynamic and static, to be scan controlled and observed using a single wire two-phase global clock, that is, the level 2 clock. The level 2 clock runs continuously even during scan control and observation of a scannable circuit element. Consequently, current transients on the power bus along with the injection of power supply switching noise into the various semiconductor devices of the VLSI device are avoided, because the level 2 clock is not halted and subsequently restarted following a scan operation. Moreover, the "multiplexer" device commonly placed at the input of each clocked storage element to switch between non-scan data and scan data to perform scan control and observation of a scannable clocked storage element is no longer necessary. Consequently, by keeping the level 2 clock and the level 1 clock constantly running current transients are avoided in the VLSI device, which is useful in applying automatic test pattern generation (ATPG) test vectors during device life test and burn in. Furthermore, performance in terms of data latency is improved in the VLSI device because the conventional scan multiplexer device is removed from the data path in front of each clocked storage element within the VLSI device. Lastly, due to timing of the scan out clock and the level one clock, the illustrative embodiment of the present invention increases the speed of a scan data shift operation, which allows more scan data to be scanned.

The illustrative embodiment of the present invention overcomes the problems of system clock stoppage and additional data latency due to a data multiplexer in the data path of a scannable circuit element. Additionally, the illustrative embodiment facilitates scan observation and control on all classes of static and dynamic circuits driven on either edge of a single wire two-phase clock common to all clocked elements. Specifically, the system allows for scan test at any speed of the level 2 clock. This allows for sequential scan test whereby multiple clock cycles can be sampled or for built in self test (BIST) where a randomized scan vector can be placed onto the scan data path for multiple scan evaluation cycles. In addition, the system facilitates delay fault testing of critical circuits in either phase of the system clock at full speed. That is, delay fault testing of a data pipeline that evaluates during the A-phase of the clock when the clock is at a logic "1" level and delay fault testing of a data pipeline that evaluates in the B-phase of the clock when the clock is at a logic "0" level. Moreover, the illustrative embodiment of the present invention allows for the scan clock and the control circuitry to be powered down during normal system data evaluation. Finally, the system of the illustrative embodiment of the present invention is able to conserve power and reduce heat dissipation of a VLSI device by turning on and off specific clock signals to clocked logic elements that are not executing.

The system of the present invention provides a range of significant benefits to the designers of VLSI devices and particularly to the designers and the architects of microprocessors. The present invention allows the designer or architect to add scan control and observation to dynamic and static logic elements without adding an additional gate delay to critical paths within the logic elements. Moreover, the system increases fault coverage of a VLSI design, such as a microprocessor and significantly lowers costs associated with test generation and functional test at the die level, component level, board level and system level. As a result, the diagnostic capability provided by the illustrative embodiment of the present invention facilitates functional tests of a VLSI design that, in turn, results in lower functional test development costs for VLSI designs, as well as lowering the time required to develop and perform functional testing of the design itself.

FIG. 1 is a block diagram of the exemplary system 10 that is suitable for practicing the illustrative embodiment of the present invention. The exemplary system 10 includes the clock control circuit 12, the level 2 clock driver 18, the system controller 16 and the logic circuit 14. Scan data enters the logic circuit 14 on the scan data input node 20 and exits the logic circuit 14 on the scan data output 22. The system controller 16 is adapted to receive the level 2 clock signal on its input node 24 from a phase locked loop (PLL) device, a delay locked logic (DLL) device or from an additional clock driver (not shown). The system controller 16 is coupled to other clock domains (if applicable) in the VLSI design and to other system controllers via the system control input node 26. Those skilled in the art will recognize that the system control input node 26 can include additional input nodes depending on the application and configuration of the system to provide the clock control circuit 12 and the logic circuit 14 with test mode information and control signal timing as well as, the interface to other clock domains that provide other primary inputs for the exemplary system 10. The system controller 16 is responsible for controlling operation of the clock control circuit 12 via control signals that enable and disable the generation of various clock signals generated by the clock control circuit 12. The system controller 16 asserts one or more control signals or clock signals or both, such as the level 0 clock enable signal 46, the scan out clock enable signal 44, the scan in clock enable signal 42, the level 1 clock enable signal 40 and the reset signal 38 to control operation of the exemplary system 10.

The clock control circuit 12 is configured to include the control and enable piping circuit 30, the scan out clock generation circuit 32, the scan in clock generation circuit 34 and the level 1 clock generation circuit 36. The control and enable piping circuit 30 receives from the system controller 16 the reset signal 38, the level 1 clock enable signal 40, the scan in clock enable signal 42, the scan out clock enable signal 44, and the level 0 clock enable signal 46. The control and enable piping circuit 30 is coupled to the scan out clock generation circuit 32, the scan in clock generation circuit 34, the level 1 clock generation circuit 36, and the logic components circuit 14. The control and enable piping circuit 30 controls, conditions and distributes the various enable signals provided by the system controller 16 to the appropriate clock generation circuit and logic circuit 14. For example, the control and enable piping circuit 30 controls the assertion of the scan out clock enable signal 42 to the scan out clock generation circuit 32, it also controls, conditions and asserts the scan in clock enable signal 42 to the scan in clock generation circuit 34 and likewise, controls, conditions and asserts the level 1 clock enable signal 40 to the level 1 clock generation circuit 36. In addition, the control and enable piping circuit 30 controls, conditions and asserts the level 0 clock enable signal 46 to the logic circuit 14.

The level 2 clock driver 18 is also coupled to the level 2 clock input 24 and is able to drive the level 1 clock generation circuit 36, the scan in clock generation circuit 34 and the scan out clock generation circuit 32 with the level 2 clock signal to synchronize clock generation in each of the clock generation circuits. Those skilled in the art will recognize that the level 2 clock driver 18 can be coupled to the level 2 clock input 24 through the system controller 16 to allow for pre-conditioning of the level 2 clock signal, or for additional control over a clock domain or the like. The scan out clock generation circuit 32 is coupled to the logic circuit 14 via the scan out clock path 54, the scan in clock generation circuit 34 is coupled to the logic circuit 14 by the scan in clock path 52, while the level 1 clock generation circuit 36 is coupled to the logic circuit 14 by the level 1 clock path 50. The scan out clock generation circuit 32, the scan in clock generation circuit 34 and the level 1 clock generation 36 will be discussed below in more detail.

In operation, when the system controller 16 asserts the level 1 clock enable signal 40, that is, raises the level 1 clock enable signal 40 to a logic "1" level, the level 1 clock generation circuit 36 generates and asserts a single wire two-phase clock signal common to all logic elements in the logic circuit 14. The level 1 clock generated by the level 1 clock generation circuit 36 is synchronous to the level 2 clock provided by the level 2 clock driver circuit 18. The level 1 clock generated by the level 1 clock generation circuit 36 runs continuously to satisfy the timing requirements of all dynamic components and circuits within the logic circuit 14. In this manner, all A-phase dynamic circuits within the logic circuit 14 are able to remain in their pre-charged state unless they are being scan evaluated, in which case they are in their scan evaluate state. In like fashion, all B-phase dynamic circuits properly evaluate during the B-phase of the level 1 clock generated by the level 1 clock generation circuit 36 even if the A-phase dynamic circuit is in its scan evaluate state.

Those skilled in the art will recognize that A-phase dynamic logic refers to dynamic logic circuits that are in the evaluate state in the A-phase of the level 1 clock, that is, when the level 1 clock is at a logic "1" level and are in a pre-charge state when the level 1 clock is in the B-phase or at logic "0" level. In like manner, a B-phase dynamic logic circuit is in its evaluate state when the level 1 clock is in its B-phase or at a logic "0" level and the B-phase dynamic logic circuit is in its pre-charge state when the level 1 clock is in it's A-phase or logic "1" level.

Figure 2:
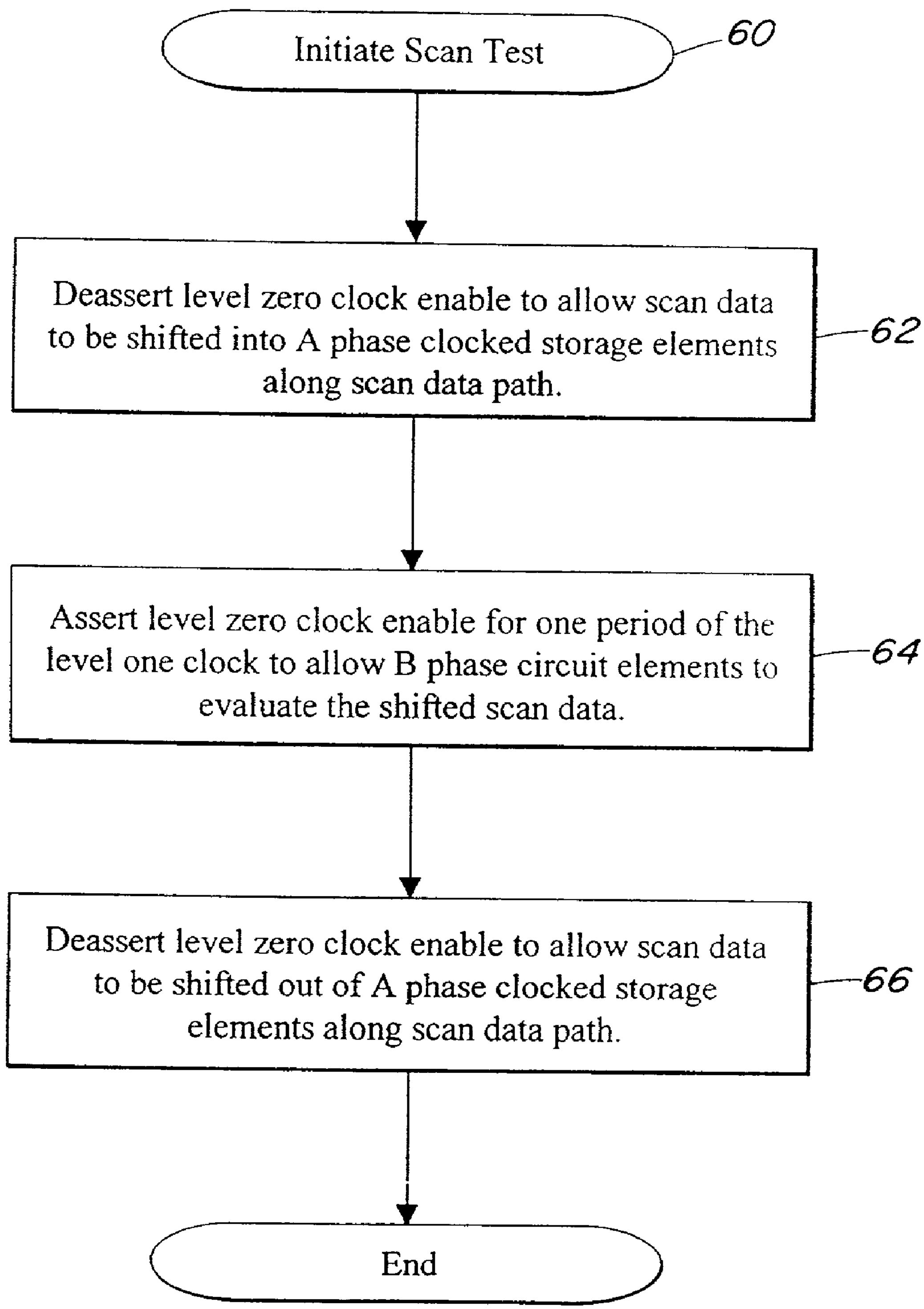
FIG. 2 is a flow diagram that depicts the steps taken to perform scan test on a clocked storage element.
Figure 4:
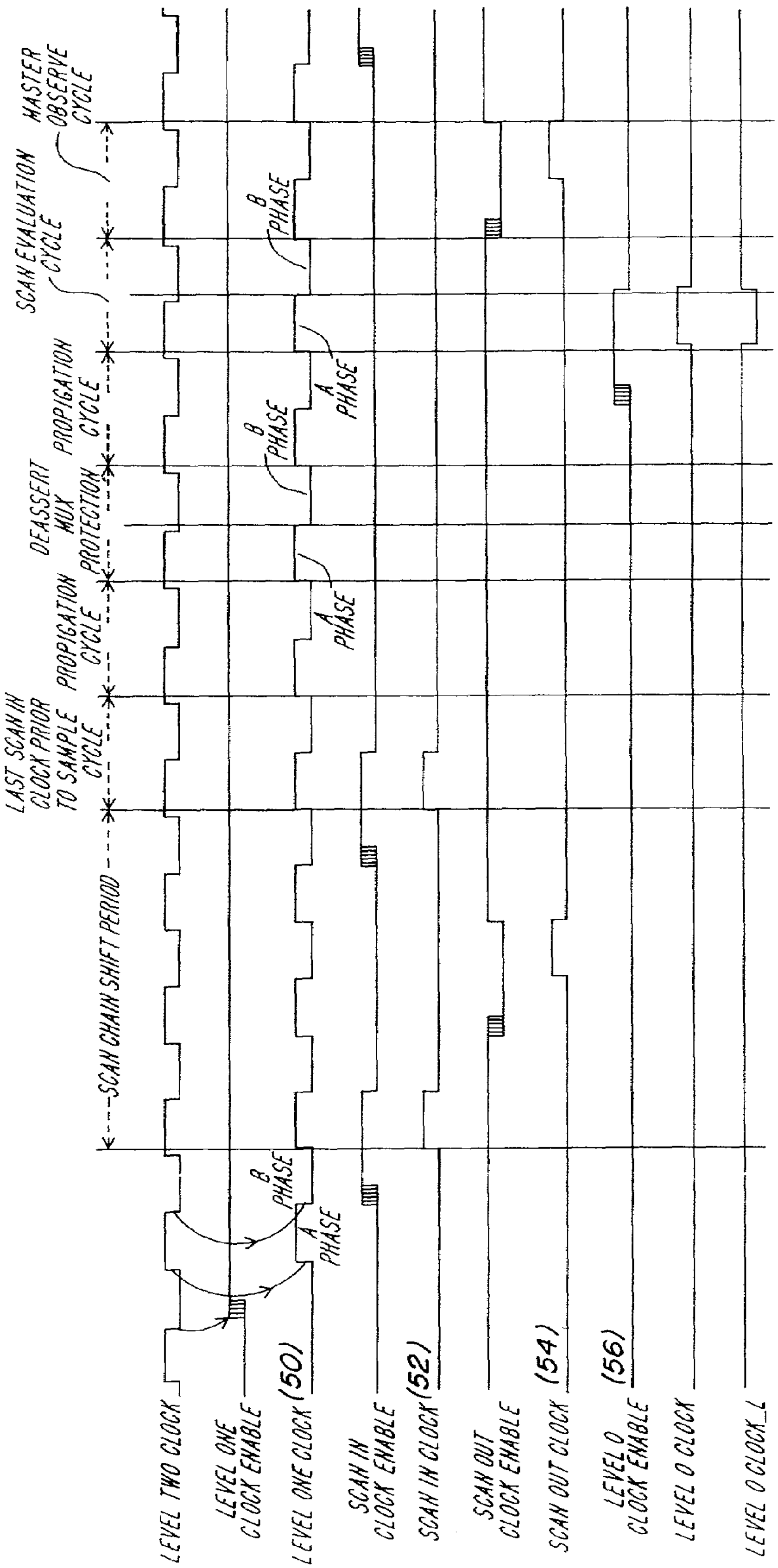
FIG. 4 is a timing diagram that illustrates the relation of the clock signals within the illustrative embodiment of the present invention.

With reference to FIG. 2 and FIG. 4, the exemplary system 10 initiates scan test (Step 60 in FIG. 2) by deasserting the level 0 clock enable signal 46 to block or halt non-scan data on the non-scan data paths of the logic circuit 14 from propagating and to enable the scan data paths of the logic circuit 14 (Step 62 in FIG. 2). This allows the scan in clock generated by the scan in clock generation circuit 34 to load or shift scan data into a logic element, such as a test vector into the logic circuit 14 via the scan data input node 20. The scan test vector is shifted into the scannable logic elements, such as latches and flip-flops of the exemplary system 10 during the A-phase of the level 1 clock.

The exemplary system 10 asserts the level 0 clock enable for one period of the level 1 clock to allow the scannable A-phase logic elements to evaluate the scan data (Step 64 in FIG. 2). After evaluation by the A-phase logic elements, the exemplary system 10 deasserts the level 0 clock enable and asserts the scan out clock enable signal 44 to capture or shift the scan data evaluated by the A-phase logic elements of the logic circuit 14 to the next scannable logic element or outputted via the scan data output node 22 to other system elements (Step 66 in FIG. 2). Those skilled in the art will recognize that the scan in clock and the scan out clock are non-overlapping synchronous clocks to prevent race conditions on the scan data path.

Figure 3:
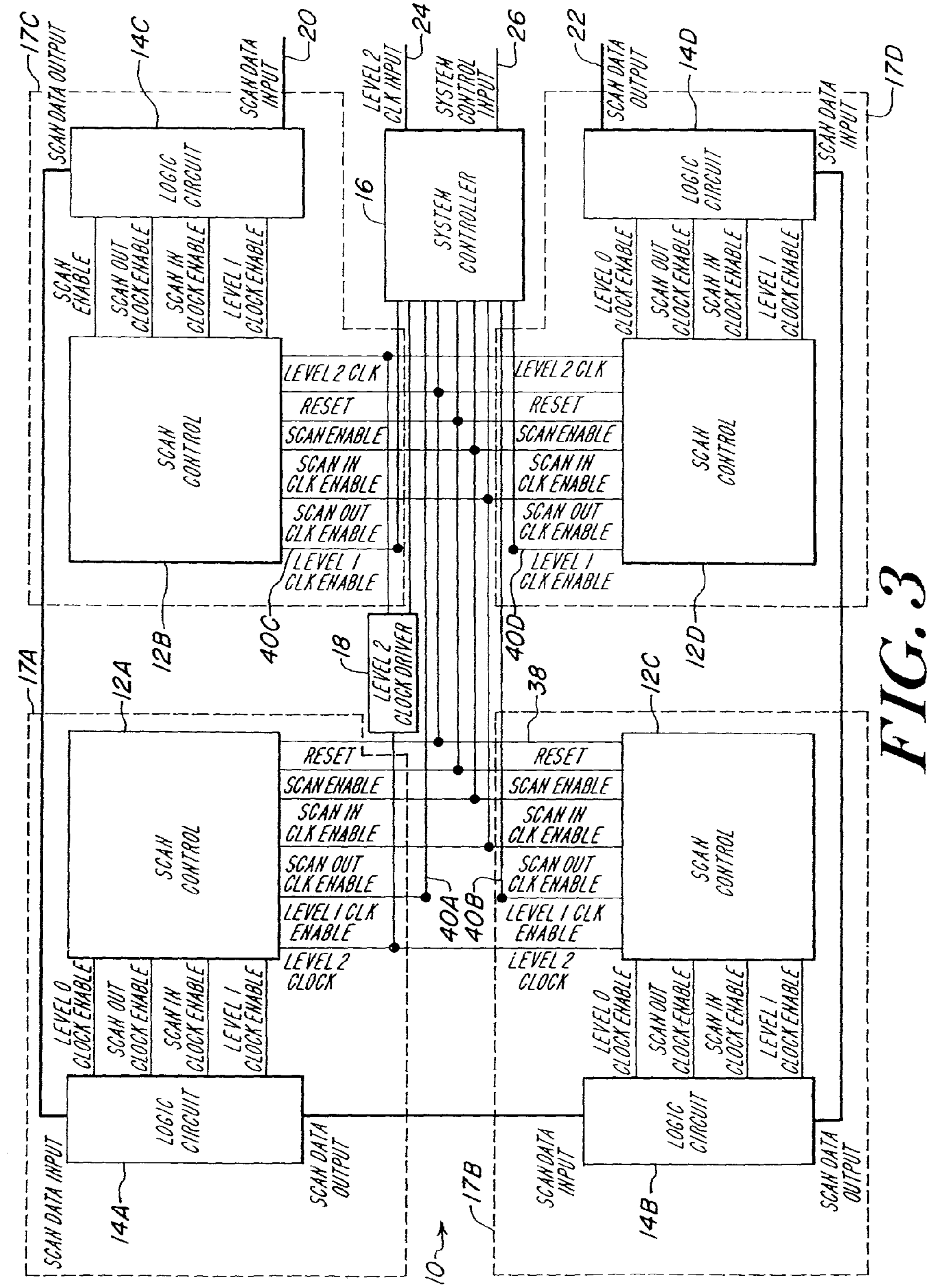
FIG. 3 is a block diagram that depicts how the system of the illustrative embodiment of the present invention can be expanded upon to control segmented areas of a VLSI design.

FIG. 3 illustrates that the exemplary system 10 can be configured to control more than one logic and state element section of a VLSI design, such as section 17A, 17B, 17C and 17D. Each logic and state element section 17A, 17B, 17C and 17D has a scan data input node and a scan data output node to form a continuous serial scan chain through the four logic and state element sections. In addition, each logic and state element section, 17A, 17B, 17C and 17D receives the scan in clock enable signal 42 and the scan out clock enable signal 44 simultaneously from the system controller 16. Further, each logic and state element section 17A, 17B, 17C and 17D receives a unique level 1 clock enable signal from the system controller 16 to allow the system controller 16 to disable the level 1 clock to any particular section in order to halt all activity within the logic circuits of the selected logical state element section. As such, the system controller 16 can enable or disable operation of the logic circuit 14A via the level 1 clock enable signal 40A.

In like manner, the system controller 16 can disable or enable the operation of the logic circuit 14B via the level 1 clock enable signal 40B. Likewise, the system controller 16 can enable and disable the logical operation of the logic circuit 14C by enabling and disabling the level 1 clock enable signal 40C. Finally, the system controller 16 can enable and disable the logical operation of the logic circuit 14D by enabling and disabling the level 1 clock enable signal 40D. Those skilled in the art will recognize that the exemplary system 10 may include fewer than four logic and state element sections, such as two sections and the exemplary system 10 may include more than four logic and state element sections, such as five or more depending upon the application.

The ability to partition logic and state elements into particular sections allows the system controller 16 or any other controller coupled to the system controller 16 to selectively enable and disable logic sections to reduce power consumption of the VLSI device. In addition, the logical operations in one or more sections can be halted in the event that the system controller 16 or some other device, such as a service microprocessor detects a high temperature indication in a particular area of the VLSI device.

The exemplary system 10 is able to scan control and observe all types of clocked storage elements. Thus allowing the circuit designer and the system architect to utilize clocked storage element in the scan chain that previously did not adapt well to conventional scan test methods and systems. In addition, the exemplary system 10 also provides the control necessary to stop activity in one or more logical sections of a VLSI device to conserve power and to prevent damage to the VLSI device itself as the result of an unacceptable high temperature indication within a portion of the VLSI device. Consequently, the exemplary system 10 of the illustrative embodiment allows for a more robust VLSI device in terms of its use and implementation of synchronous sequential circuits. For example, the exemplary system 10 can perform scan observation and control on dynamic logic circuits that operate off of either the rising edge of the level 1 clock signal 50 or the falling edge of the level 1 clock signal 50.

FIG. 4 is a timing diagram that illustrates the relationship of the various control signals and clock signals utilized by the exemplary system 10. The level 2 clock is a low skew single wire two phase global clock that is distributed throughout the exemplary system 10. The level 2 clock can be generate by a PLL within the exemplary system 10 or can be provided by an external PLL or some other stable clock generation device. The level 2 clock is utilized by the system controller 16 to transmit the reset signal 38 to the clock control circuit 12. Those skilled in the art will recognize that the system controller 16 may also utilize the level 2 clock to control data to the clock control circuit 12 via latches and flip-flops that are non-scannable. The level 1 clock is synchronous to the level 2 clock and is gated via the level 1 clock enable, which allows the logic circuit 14 to be powered down when not in use. The generation of the level 1 clock along with the generation of the scan in clock and the scan out clock will be discussed below in more detail with reference to FIGS. 6, 7 and 8. Generation of the level 0 clock occurs within the scannable logic element itself. As such, the level 0 clock is a derivative of the level 1 clock. Generation of the level 0 clock is discussed below in conjunction with FIGS. 9–12.

As FIG. 4 illustrates, the level 2 clock, also known in the art as the system clock, along with the level 1 clock orchestrate the multitude of events within the logic circuit 14. Both clocks run continuously to satisfy the dynamic circuit requirements of the exemplary system 10.

The level 1 clock becomes active when the level 1 clock enable signal is asserted, that is, raised to a logic "1" level. As long as the level 1 clock enable is asserted, the level 1 clock signal runs freely. In like manner, generation of the scan in clock is controlled by the scan in clock enable. The scan in clock rises from a logic "0" level to a logic "1" level within a half clock cycle after the scan in clock enable rises from a logic "0" level to a logic "1" level. The scan in clock falls from a logic "1" to a logic "0" in phase with the deassertion of the scan in clock enable. In similar fashion the scan out clock is controlled by the scan out clock enable. The scan out clock enable operates under a negative logic convention, that is, the scan out clock is generated when the scan out clock enable transitions from a logic "1" level to a logic "0" level. The scan out clock pulse rises from a logic "0" level to a logic "1" level within half a cycle of the scan out clock enable signal being asserted and falls from a logic "1" level to a logic "0" level when the scan out clock enable is deasserted. As mentioned above, the level 0 clock is derived within the scannable element itself by gating the level 0 clock enable with the level 1 clock. As such, when the level 1 clock is at a logic "1" level and the level 0 clock enable is at a logic "1" level a level 0 clock pulse having a logic "1" value is produced that lasts one half of the level 1 clock cycle. The level 0 clock signal is shifted slightly ahead of the inverted level 0 clock due to the propagation delay of inverting the level 0 inverted clock to produce the level 0 clock. So long as the level 0 clock enable is held at a logic "0" value, any of the scannable A-phase elements in the exemplary system 10 are prevented from evaluating. As a result, scan data is shifted into each scannable element and evaluated scan data is shifted out of each scannable element during the time frame depicted as the scan shift.

As FIG. 4 depicts, at the completion of the scan chain shift period, the scan in clock is enabled before the scan chain shift period ends to ensure that scan data is shifted into each of the scannable A-phase devices before scan evaluation occurs. The propagation period allows non-scan data to propagate through the exemplary system 10 and allows B-phase devices to evaluate. The deassert multiplexer protection period ensures that one-hot multiplexers, such as pass gate multiplexers, within the exemplary system 10 have at least one input selected before data is allowed to propagate. In this manner, multiple transactions trying to use the same physical resource at the same time, this is often referred to as electrical contention. Further, the deassert multiplexer protection period allows for resolution of any electrical or data contentions that may arise under randomized data, such as scan data. An additional propagation period follows the deassert multiplexer protection period to allow non-scan data to propagate through the exemplary system 10. Following the second propagation period, the scan evaluation period occurs and the level 0 clock is produced within each A-phase scannable device. Following the scan evaluation period, the scan out clock is enabled to shift the evaluated scan data out of each scannable element as part of the master observe period. At this point, a second scan chain shift period can begin if desired or initiation of the second scan chain shift period can occur after any number of level 1 clock cycles following the master observe period depending on the need of the VLSI at the time.

FIG. 4 illustrates that the scan in clock and the scan out clock of the exemplary system 10 are synchronous with the level 2 clock, but are two-phase architecturally non-overlapping to make the scan chain of the exemplary system 10 race proof and scalable with many semiconductor processors. This avoids the need to perform minimum timing checks on the scan chain. In addition, one skilled in the art will recognize that the scan chain shift period depicted in FIG. 4 may be longer than three clock cycles depending on the configuration of the data pipeline being scanned or the type of scan testing being performed, for example, sequential scan testing, delay fault testing and multiple cycles of BIST.

Figure 5:
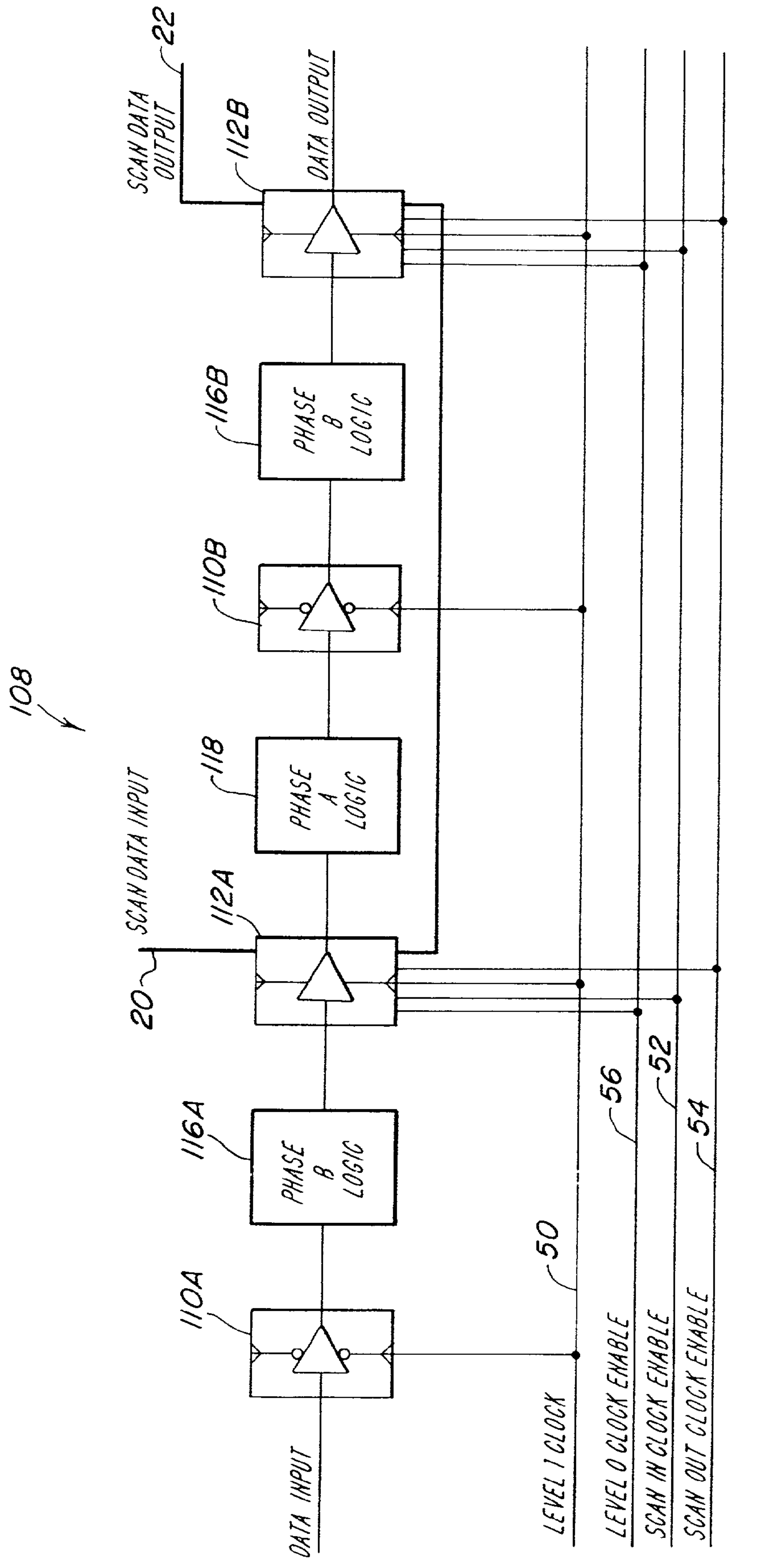
FIG. 5 is a circuit block diagram that illustrates an exemplary pipeline stage suitable for use with an illustrative embodiment of the present invention.

FIG. 5 illustrates an exemplary data pipeline 108 configured to be scan controlled and observed within the logic circuit 14. As illustrated, the A-phase clocked storage elements are scanned and all B-phase circuits, both static and dynamic, along with non-scanned A-phase circuits to continue to evaluate and pre-charge normally. Thus, avoiding the negative effects of di/dt associated with halting the level 2 clock.

The scannable A-phase buffer latch 112A and 112B receive from the clock control circuit 12 the appropriate clock and control signals to evaluate non-scan data and evaluate scan data evaluation. The clock and control signals include the level 1 clock signal 50, the scan in clock signal 52, the scan out clock signal 54 and the level 0 clock enable signal 56. The level 1 clock signal 50 is coupled to each clocked storage element in the exemplary data pipeline 108. For example, the B-phase buffer latch 110A, 110B, and the scannable A-phase buffer latch 112A and 112B. Those skilled in the art will appreciate that the B-phase logic circuit 116A, 116B and the A-phase logic circuit 118 can also be coupled to the level 1 clock signal 50 as necessary. The B-phase buffer latch 110A, 110B and the scannable A-phase buffer latch 112A, 112B are level sensitive devices, but one skilled in the art will recognize that an edge triggered device, such as a flip-flop may be substituted for one or more of the level sensitive latches as necessary.

The scannable A-phase buffer latch 112A and 112B are coupled to one another via the scan dataline to form a serial scan chain. The scannable A-phase buffer latch 112A is adapted to include the scan data input node 20 while the scannable A-phase buffer latch 112B is adapted to include the scan data output node 22 for the exemplary data pipeline 108. Coupled to the output of the B-phase scan latch 110A is a B-phase logic circuit 116A that evaluates in the B-phase of the level 1 clock signal 50 to drive the scannable A-phase buffer latch 112A. In similar fashion, the A-phase logic circuit 118 is coupled to the output of the scannable A-phase buffer latch 112A and evaluates the data asserted by the scannable A-phase buffer latch 112A during the A-phase of the level 1 clock signal 50. The A-phase logic circuit 118, in turn, drives the B-phase buffer latch 110B, which, in turn, drives the B-phase logic circuit 116B. The B-phase logic circuit 116B evaluates the data asserted by the B-phase buffer latch 110B when the level 1 clock signal 50 is in its B-phase and asserts its evaluated data value in the B-phase of the level 1 clock signal 50 to drive the scannable A-phase buffer latch 112B.

The operation of the scannable A-phase buffer latch 112A and 112B along with the operation of an exemplary A-phase logic circuit 118 and the exemplary B-phase logic circuit 116A and 116B will be discussed in more detail below. Nevertheless, those skilled in the art will recognize that the B-phase logic circuit 116A, 116B and the A-phase logic circuit 118 are combinational circuits that can have multiple circuit topologies. In addition, those skilled in the art will recognize that the use of edge triggered flip-flops in the exemplary data pipeline 108 requires that the circuit coupled between the output of a first flip-flop and the input of a second flip-flop have a sufficient amount of delay to avoid a hold time violation of the second flip-flop.

Figure 6:
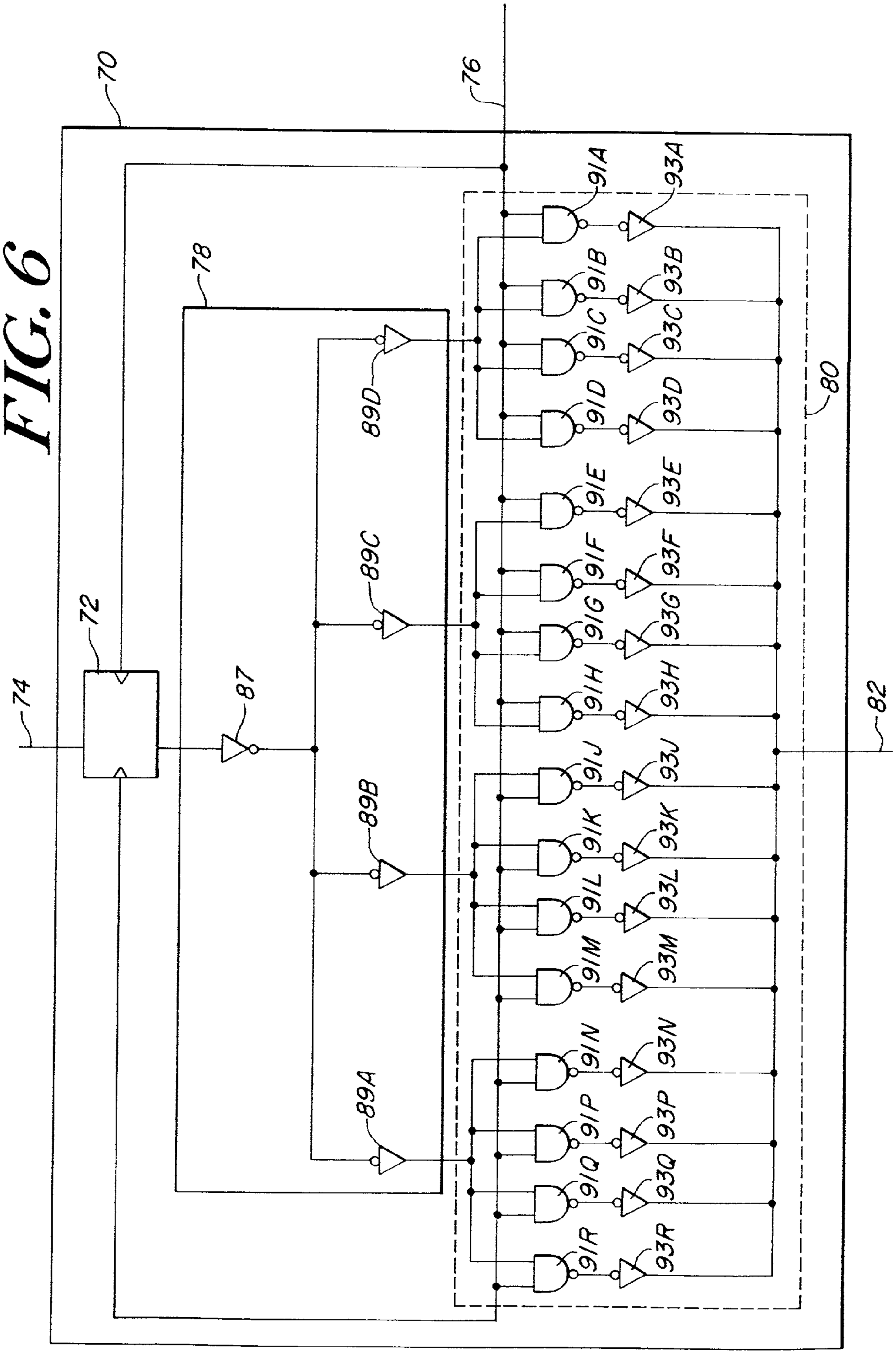
FIG. 6 illustrates a circuit diagram suitable for generating the level 1 clock signal in the illustrative embodiment of the present invention.

FIG. 6 illustrates a clock generation circuit suitable for use as the scan in clock generation circuit 34. The clock generation circuit 70 is configured to include a B-phase latch 72 coupled to an input control signal 74, the level 2 clock at input node 76 and the buffer circuit 78. The buffer circuit 78 drives the fan out circuit 80, and the timed dependent signal generated by the clock circuit 70 is asserted on the output node 82.

In operation, the B-phase latch 72 receives a control signal such as the scan in clock enable signal 44 at its input node 74. The B-phase latch 72 is clocked by the level 2 clock from the level 2 clock driver 18 or other suitable source of the level 2 clock. In this manner, when the scan in clock enable signal 42 is at a logic "1" level and the level 2 clock is at logic "0" level the B-phase latch 72 asserts a logic "1" level to the buffer circuit 78. In similar fashion, if the scan in clock enable signal 42 is deasserted to a logic "0" level or the level 2 clock asserted by the level 2 clock driver 18 rises to a logic "1" level the B-phase latch 72 asserts a logic "0" level to the buffer circuit 78.

The buffer circuit 78 is driven by the B-phase latch 72 and in turn fans out the value asserted by the B-phase latch 72 to provide multiple identical inputs to the fan out circuit 80. The buffer circuit 78 is configured to have a single buffer driver 87 drive four additional buffer drivers 89A, 89B, 89C and 89D. The buffer circuit 78 can be configured with other buffer driver topologies without departing from the scope of the present invention.

The fan out circuit 80 is configured so that each buffer driver 89A, 89B, 89C and 89D drives a first input of up to four NAND gates, while the level 2 clock drives the second input of each NAND gate. The fan out circuit 80 is configured to have like NAND gates and like buffer drivers throughout. For example, NAND gate 91A, 91B, 91C and so forth, along with buffer driver 93A, 93B, 93C and so forth. For ease of the discussion below, one NAND gate and one buffer driver will be discussed in detail, namely, NAND gate 91A and buffer driver 93A. Those of ordinary skill in the art will recognize that this is not meant to limit the scope of the present invention, but merely eliminate cumulative discussion. The output node of NAND gate 91A is coupled to the input of the buffer driver 93A whose output is coupled to the output node 82. The NAND gate 91A is a two input NAND gate with one input coupled to the output of the buffer driver 89D and the other input coupled to the level 2 clock input node 76. In this manner, if the output asserted by the B-phase latch 72 is a logic "1" level and level 2 clock is at a logic "1" level, a logic "1" level is asserted at the output node 82. If the output asserted by the B-phase latch 72 is a logic "0" level or the level 2 clock is at a logic "0" level, a logic "0" level is asserted at the output node 82. In this manner, the clock generation circuit 34 produces a two-phase clock on the output node 82 synchronous to the level 2 clock itself. As a result, clock skew is minimized between the level 2 clock and the scan in clock signal generated by the clock generation circuit 34 to minimize race conditions within the exemplary system 10.

Figure 7:
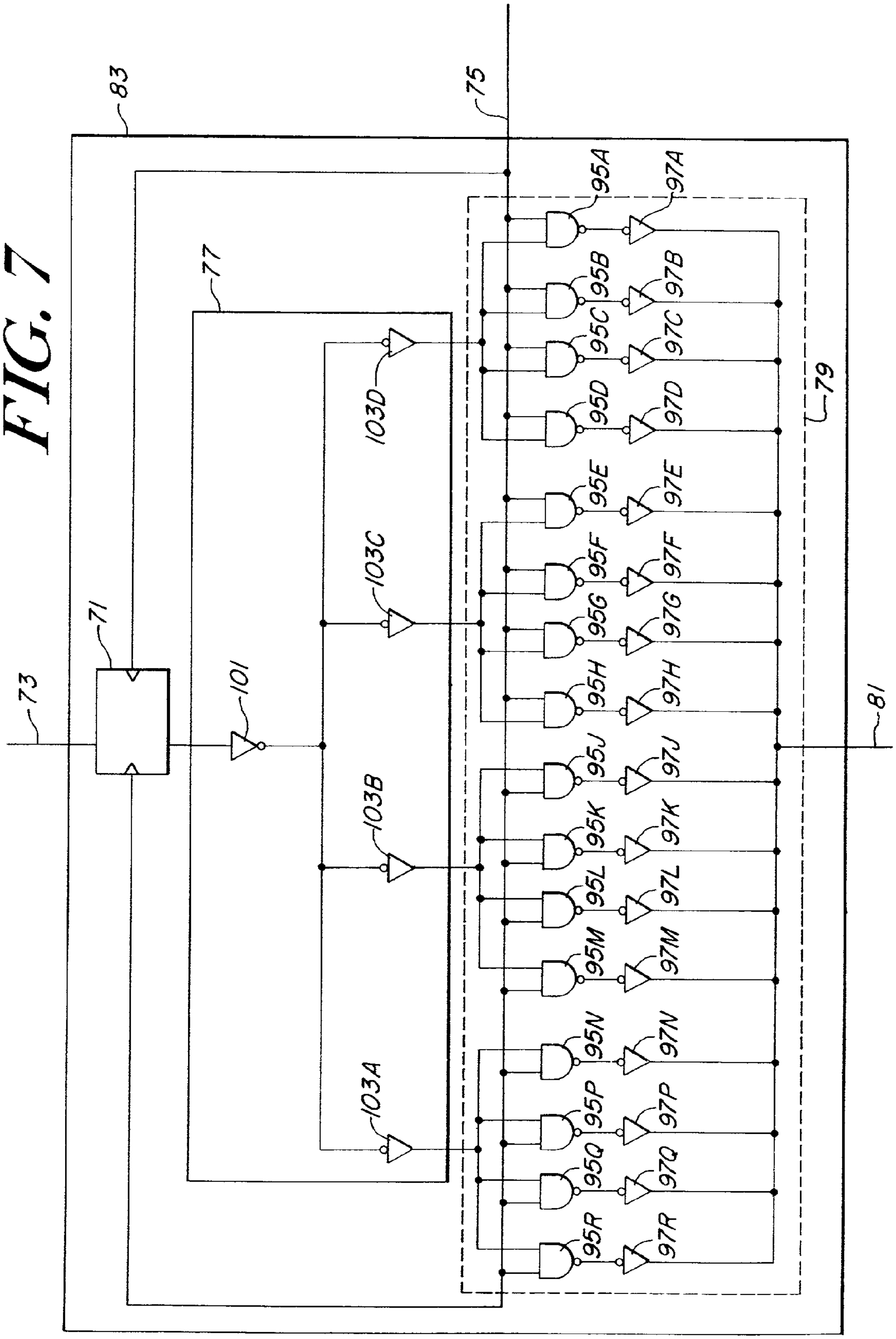
FIG. 7 illustrates a circuit diagram suitable for generating the scan in clock signal in the illustrative embodiment of the present invention.

FIG. 7 illustrates a clock generation circuit 83 suitable for use as the level 1 clock generation circuit 36. The clock generation circuit 83 is configured to include a B-phase latch 71 coupled to an input control signal 73, the level 2 clock at input node 75 and the buffer circuit 77. The buffer circuit 77 drives the fan out circuit 79, which asserts the time dependent signal generated by the clock circuit 83 on the output node 81.

In operation, the B-phase latch 71 receives an input control signal such as the level 1 clock enable signal 40. The B-phase latch 71 is clocked by the level 2 clock from the level 2 clock driver 18. In this manner, when the level 1 clock enable signal 40 is at a logic "1" level and the level 2 clock is at logic "0" level the B-phase latch 71 asserts a logic "1" level to the buffer circuit 77. In similar fashion, if the clock enable signal 40 is deasserted to a logic "0" level or the level 2 clock asserted by the level 2 clock driver 18 rises to a logic "1" level the B-phase latch 71 asserts a logic "0" level to the buffer circuit 77.

The buffer circuit 77 is driven by the B-phase latch 71 and, in turn, fans out the value asserted by the B-phase latch 71 to provide multiple identical inputs to the fan out circuit 79. The buffer circuit 77 is configured to have a single buffer driver 101 drive four additional buffer drivers 103A, 103B, 103C and 103D. The buffer circuit 77 can be configured with other buffer driver topologies without departing from the scope of the present invention.

The fan out circuit 79 is configured with multiple like NAND gates having their output coupled to the input of multiple like buffer drivers. For example, NAND gates 95A, 95B, 95C and buffer drivers 97A, 97B, 97C and so on. Consequently, to eliminate cumulative discussion, the detailed operation of the fan out circuit 79 will be limited to one NAND gate and one buffer driver pair, namely, NAND gate 95A and buffer driver 97A. The NAND gate 95A is a two input NAND gate with one input coupled to the output of buffer driver 103D and the second input coupled to the level 2 clock input node 75. In operation, if the B-phase latch 71 asserts a logic "1" level and the level 2 clock is at a logic "1" level the fan out circuit 79 asserts a logic "1" level at the output node 81. If the B-phase latch 71 asserts a logic "0" level or the level 2 clock is at a logic "0" level, the fan out circuit 79 asserts logic "0" level at the output node 81. In this manner, the output asserted by the B-phase latch 71 is gated with the level 2 clock to produce a two-phase clock signal on the output node 81 synchronous to the level 2 clock itself. As a result, clock skew is minimized between the level 2 clock and the level 1 clock signal 50 to minimize race conditions within the exemplary system 10.

Figure 8:
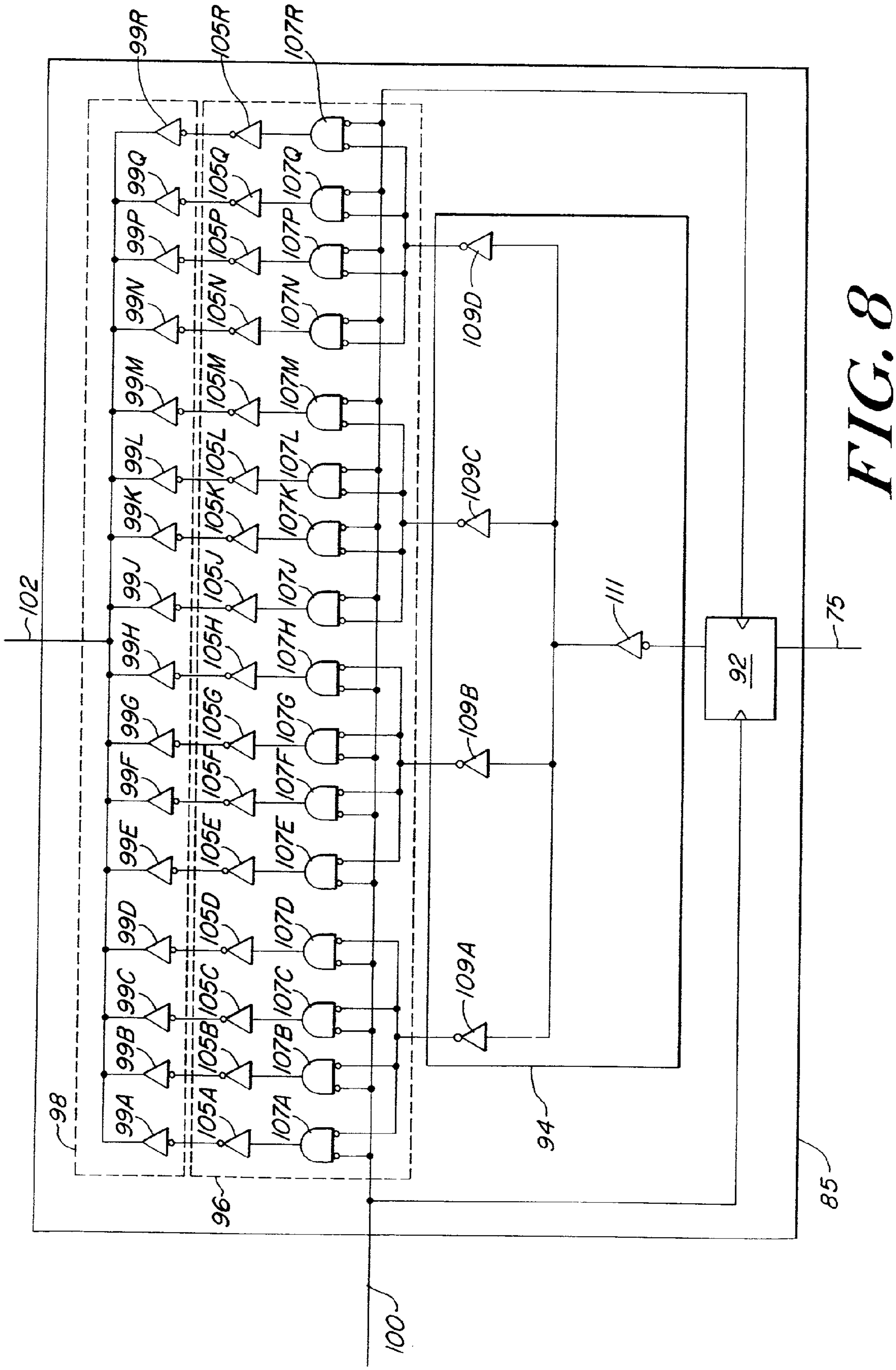
FIG. 8 illustrates a circuit diagram suitable for generating the scan out clock signal in the illustrative embodiment of the present invention.

FIG. 8 illustrates a clock generation circuit 85 suitable for use as the scan out clock generation circuit 32. The clock generation circuit 85 is configured to include a A-phase latch 92 coupled to an input control signal 75, the level 2 clock at input node 100 and the buffer circuit 94. The buffer circuit 94 drives the fan out circuit 96, which, in turn, drives the buffer circuit 98. The buffer circuit 98 asserts the time dependent signal generated by the clock circuit 32 on the output node 102.

In operation, the A-phase latch 92 receives an enable signal such as the scan out clock enable 44. The A-phase latch 92 is clocked by the level 2 clock from the level 2 clock driver 18. In this manner, when the scan out clock enable signal 44 is at a logic "1" level and the level 2 clock is at logic "0" level the A-phase latch 92 asserts a logic "1" level to the buffer circuit 94. In similar fashion, if the clock enable signal 44 is deasserted to a logic "0" level or the level 2 clock asserted by the level 2 clock driver 18 rises to a logic "1" level, the A-phase latch 92 asserts a logic "0" level to the buffer circuit 94.

The buffer circuit 94 is driven by the A-phase latch 92 and, in turn, fans out the value asserted by the A-phase latch 92 to provide multiple identical inputs to the fan out circuit 96. The buffer circuit 94 is configured to have a single buffer driver 111 drive four additional buffer drivers 109A, 109B, 109C and 109D. The buffer circuit 94 can be configured with other buffer driver topologies without departing from the scope of the present invention.

The fan out circuit 96 is configured with like NOR gates that drive like buffer drivers. For example, NOR gate 107A, 107B, 107C and buffer driver 105A, 105B, 105C and so on. In addition, the buffer driver circuit 98 is also configured to contain like buffer driver elements through out, such as 99A, 99B, 99C and so on. To avoid cumulative detailed discussion, the operation of the fan out circuit 96 and the buffer driver circuit 98 will be discussed relative to one NOR gate and one buffer driver, namely, NOR gate 107A and buffer driver 105A in the fan out circuit 96 and the buffer driver 99A in and the buffer driver circuit 98. Those skilled in the art will recognize that the other like circuit elements operate in a manner consistent with the foregoing description.

NOR gate 107A is a two input NOR gate with one input coupled to the output of the buffer driver 109A and the other input coupled to the level 2 clock input node 100. In operation, if the A-phase latch 92 asserts a logic "1" level to the fan out circuit 94 or the level 2 clock asserts a logic "1" level at the input node 100, the buffer driver 105A asserts a logic "1" level to drive the corresponding buffer driver 99A in the buffer driver circuit 98. In turn the buffer driver 99A asserts a logic "0" level on the output node 102. If the A-phase latch 92 asserts a logic "0" level and the level two clock asserts a logic "0" level or the input node 100, the buffer driver 105A asserts a logic "0" level to the buffer driver 99A, which, in turn asserts a logic "1" level at the output node 102. In this manner, the output asserted by the A-phase latch 92 is gated with the level 2 clock to produce a time dependent signal that is buffered by the buffer circuit 98 to produce two-phase clock signal on output node 102 synchronous to the level 2 clock itself. The buffer circuit 98 acts as a delay element to ensure that the scan in clock signal 52 and the scan out clock signal 54 are non-overlapping clock signals. In this manner, the scan out clock signal 54, is synchronous to the scan in clock signal 52, but architecturally non-overlapping with the scan in clock signal 52 to avoid scan chain race conditions within the exemplary system 10.

The transistors depicted in FIGS. 9–12 are from the metal oxide semiconductor field effect transistor (MOSFET) family of transistors, which include P channel MOSFETS, also referred to as PMOS transistors and N-channel MOSFETS also referred to NMOS transistors and complementary symmetry MOSFETS also referred to as CMOS transistors. Nevertheless, those skilled in the art will appreciate that the present invention may be practiced with clocked storage elements having characteristics of a dynamic logic family or a static logic family.

Figure 9:
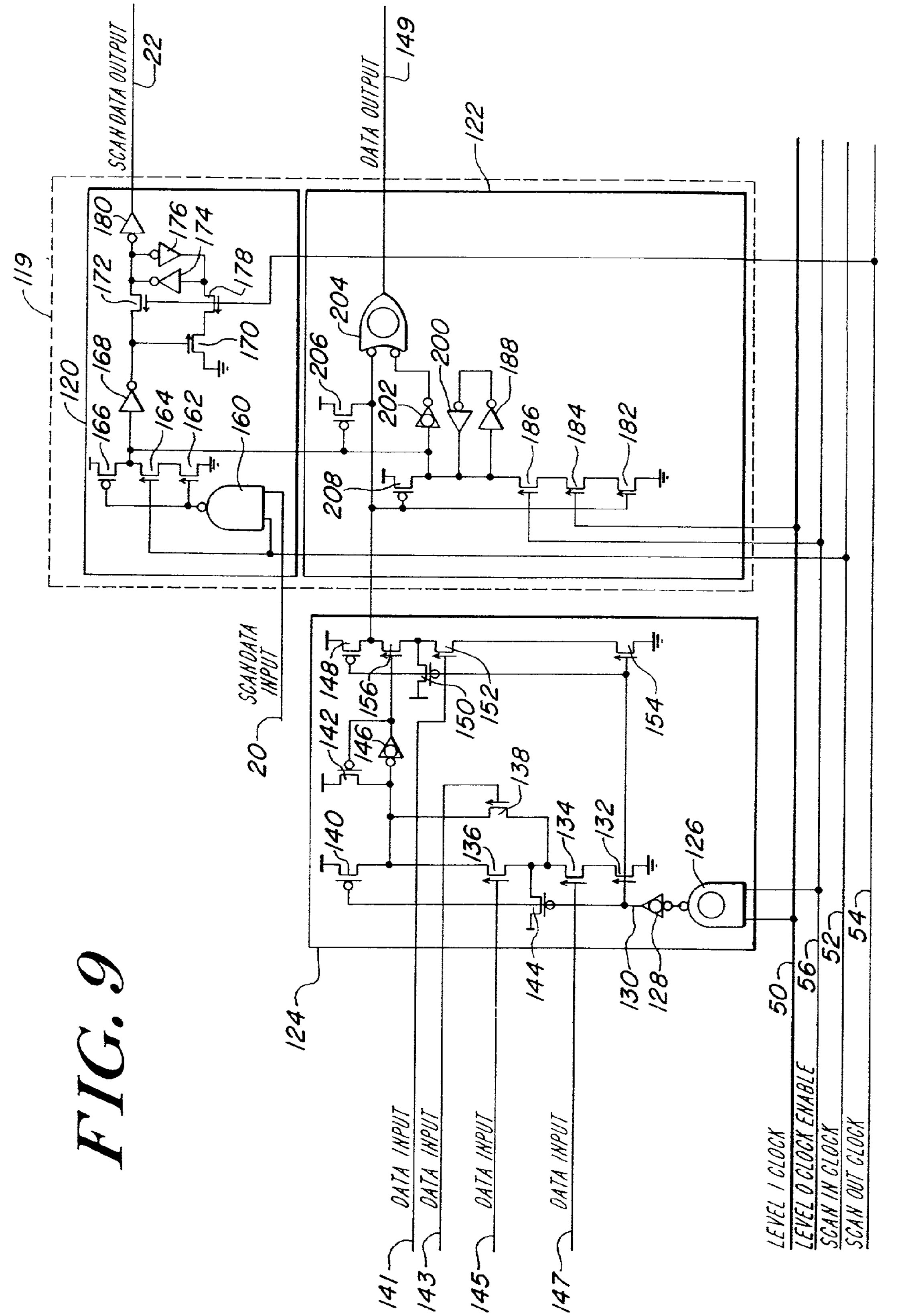
FIG. 9 is a schematic diagram of a dynamic circuit suitable for use in the illustrative embodiment of the present invention.

FIG. 9 illustrates an A-phase domino circuit 124 coupled to an A-phase dynamic scan latch 119 suitable for use within the exemplary system 10. The scannable A-phase dynamic latch 119 is adapted to include an A-phase dynamic latch 122 and a scan circuit 120. As configured, the A-phase domino circuit 124 and the A-phase scannable latch 119 precharge their dynamic nodes during the B-phase of the level 1 of the clock signal 50 and evaluate their inputs when the level 1 clock signal 50 is in the A-phase. Nevertheless, those skilled in the art will recognize that exemplary system 10 can be configured so that the B-phase clocked storage elements are scanned and the A-phase clocked storage elements are not.

The A-phase domino circuit 124 is configured to receive four data inputs on data input node 141, 143, 145 and 147. Operation of the A-phase domino circuit 124 is controlled by the level 0 clock signal 130 derived by gating the level 1 clock signal 50 and the level 0 clock enable signal 56. The output of the A-phase domino circuit 124 drives the scannable A-phase dynamic latch 119 with non-scan data, which is asserted during the A-phase of the level 1 clock signal 50 on the data output node 149. The A-phase domino circuit 124 precharges its dynamic nodes when the level 1 clock signal 50 is at a logic "0" level, or in the B-phase, and evaluates the data on the input nodes 141, 143, 145 and 147 when the level 1 clock signal 50 is at a logic "1" level, or in the A-phase.

The scan circuit 120 receives scan data from the scan data input node 20 and asserts the results of the scan data evaluation on the scan data output node 22. In brief, the A-phase domino circuit 124 evaluates the data on its input nodes during the A-phase of the level 1 clock signal 50 and drives the A-phase dynamic latch 122 with the results of the evaluation while the level 1 clock signal 50 is still in its A-phase so long as the level 0 clock enable signal 56 is asserted to a logic "1" level. If the level 0 clock enable signal 56 is deasserted to a logic "0" level, the A-phase domino circuit 124 is prevented from asserting to allow scan data to be shifted into or out of the scannable A-phase dynamic latch 119.

The A-phase domino circuit 124 gates the level 1 clock signal 50 and the level 0 clock enable signal 56 with the NAND gate 126 whose output is coupled to the inverter 128 to derive the level 0 clock signal 130 asserted at the output of the inverter 128. The output of the inverter 128 is coupled to the gate of the NMOS transistor 132, the gate of NMOS transistor 154, the gate of the PMOS transistor 144, the gate of the PMOS transistor 140, the gate of the PMOS transistor 150 and the gate of the PMOS transistor 148. One skilled in the art will recognize NMOS transistor 132 and 154 as evaluate transistors, and that NMOS transistor 132 is the evaluate transistor for the first logic stage of the A-phase device circuit 124 and NMOS transistor 154 is the evaluate transistor for the second logic stage of the A-phase domino circuit 124.

The data input node 141 is coupled to the gate of NMOS transistor 152, the data input node 143 is coupled to the gate of the NMOS transistor 138, while the data input node 145 is coupled to the gate of NMOS transistor 136. Data input node 147 is coupled to the gate of NMOS transistor 134. The output node of the A-phase domino circuit 124 is formed by the drain of PMOS transistor 148 and the drain of NMOS transistor 156. The source of PMOS transistor 148 is coupled to a voltage source supplying a high level voltage signal. The source of NMOS transistor 156 is coupled to the drain of PMOS transistor 150 and the drain of NMOS transistor 152. The source of PMOS transistor 150 is coupled to a voltage source supplying a high level voltage signal. The source of NMOS transistor 152 is coupled to the drain of NMOS transistor 154, which has its source coupled to ground.

Inverter 146 and PMOS transistor 142 form a half latch or keeper circuit to overcome current leakage issues commonly associated with the use NMOS transistors. The inverter 146 has its input coupled to the drain of PMOS transistor 142, the drain of PMOS transistor 140, the source of NMOS transistor 136 and the source of NMOS transistor 138. One of ordinary skill in the art will recognize that the A-phase domino circuit 124 can take the form of any circuit topology performing one or more logical operands.

The A-phase domino circuit 124 performs a complex logical function on the data values received on its input nodes 141, 143, 145 and 147 if the level 0 clock enable signal 56 is asserted and the level 1 clock signal 50 is in it's A-phase. If these conditions exist so that the level 0 clock 130 is at a logic "1" level, the value asserted at the input node 143 is logically "OR" ed with the value asserted at the input node 145 and the result of this logical OR operand is NANDed with the data value on the input node 147. The logical result from this first stage of the A-phase domino circuit 124 is inverted by the inverter 146 and logically NANDed with the data value present on the input node 141. The result of this second logic stage is asserted on the input node of the A-phase dynamic scan latch 119.

The A-phase domino circuit 124 enters the evaluate state when the level 1 clock signal 50 and the level 0 clock enable 56 are both at a logic "1" level. In this manner, evaluate transistors 132 and 154 are enabled to allow the A-phase domino circuit 124 to evaluate. So long as the level 0 clock signal 56 is deasserted to a logic "0" level, the A-phase domino circuit 124 is prevented from evaluating, which blocks data from propagating along the non-scan data path into the A-phase dynamic scan latch 119 during scan data shifting or scan data evaluation.

In more detail, during the precharge phase the A-phase domino circuit 124 precharges its output node and its other dynamic nodes to a logic "1" level. If during the evaluate phase the data value on the input node 147 is a logic "1" value and the data value on input node 143 or 145 or both is a logic "1" level, the state of the first logic stage transitions from a logic "1" level to a logic "0" level. In turn, if NMOS transistor 152 is enabled because the data value on the input node 141 is at a logic "1" level, the state of the second logic stage transitions. This causes the output of the A-phase domino circuit 124 to transition from a logic "1" level to a logic "0" level.

The A-phase dynamic scan latch 122 has its input coupled to the output of the A-phase domino circuit 124. The A-phase dynamic scan latch 122 is adapted to include the PMOS transistor 206 having its drain coupled to an input of NAND gate 204, the gate of PMOS transistor 208, the gate of NMOS transistor 182 and the input node of the A-phase dynamic scan latch 122. The PMOS transistor 206 and the PMOS transistor 208 each have their source coupled to a voltage source supplying a high level voltage signal. The output node of NAND gate 204 is coupled to the data output node 149. The second input of the NAND gate 204 is coupled to the output of the inverter 202.

The input of inverter 202 is coupled to the drain of PMOS transistor 208, the gate of PMOS transistor 206, the input of inverter 168, the drain of PMOS transistor 166 and the drain of NMOS transistor 164. The input node of inverter 202 is also coupled to the output of inverter 200, the input of inverter 188 and the drain of NMOS transistor 186. The output of the inverter 188 is coupled to the input of the inverter 200 to form a dynamic storage node.

The gate of the NMOS transistor 186 is coupled to the level 0 clock enable signal 56 and its source is coupled to the drain of the NMOS transistor 184. The gate of the NMOS transistor 184 is coupled to the level 1 clock signal 50 and its source is coupled to the drain of NMOS transistor 182. The source of NMOS transistor 182 is coupled to ground.

The A-phase dynamic scan latch 119 operates in the following fashion. If during the start of the evaluate phase of the A-phase dynamic scan latch 119, if the input of the A-phase dynamic scan latch 119 is at a logic "1" level, the output transitions to a logic "0" level if not already at a logic "0" level. If during the evaluate phase of the A-phase dynamic scan latch 119 its input transitions from a logic "1" level to a logic "0" level, the output of the A-phase dynamic scan latch 119 rises to a logic "1" level; otherwise, the output of the A-phase dynamic scan latch 119 remains at a logic "0" level.

As configured, the A-phase domino logic circuit 124 and the A-phase dynamic scan latch 119 both evaluate during the A-phase of the level 1 clock signal 50 and pre-charge their respective dynamic nodes during the B-phase of the level 1 clock signal 50. To prevent a data conflict with scan data being evaluated by the A-phase dynamic scan latch 119. The level 0 clock enable signal 56 is deasserted to a logic "0" level for one cycle of the level 1 clock signal 50, to prevent the A-phase domino logic circuit 124 from evaluating.

The scan circuit 120 is adapted to include NAND gate 160 having a first input coupled to the scan data input node 20 and a second input coupled to the scan in clock signal 52 and the gate of NMOS transistor 164. The output of the NAND gate 160 is coupled to the gate of NMOS transistor 162 and the gate of PMOS transistor 166. The source of PMOS transistor 166 is coupled to a voltage source supplying a high level voltage signal. The source of NMOS transistor 164 is coupled to the drain of NMOS transistor 162, which has its source coupled to ground. The output of inverter 168 is coupled to the gate of NMOS transistor 170 and the drain of NMOS transistor 172. The source of NMOS transistor 172 is coupled to the input of inverter 180, the input of inverter 176 and the output of the inverter 174. The gate of NMOS transistor 172 is coupled to the scan out clock signal 54. The source of the NMOS transistor 170 is coupled to ground and its drain is coupled to the source of NMOS transistor 178. The gate of NMOS transistor 178 is coupled to the scan out clock signal 54, its drain is coupled to the inverter 174 and the output of inverter 176. The output of inverter 180 is coupled to the scan data output node 22.

During scan data propagation along the scan data path, the output of the A-phase domino circuit 124 remains at a logic "1" level. If the scan data value shifted into the scan circuit 120 is at a logic "1" level the PMOS transistor 166 asserts a logic "1" level. If the scan data value shifted into the scan circuit 120 is a logic "0" value, the dynamic node formed by the drain of the PMOS transistor 166 is pulled to a logic "0" level. In either instance, when the A-phase dynamic scan latch 119 evaluates the scan data on the dynamic node of the scan circuit 120, the dynamic node is pulled to a logic "0" level and the A-phase dynamic scan latch 122 asserts a logic "0" level on the data output node 149. As a result, the scan circuit 120 asserts a logic "1" on the scan data output node 22 when the scan out clock signal 54 rises to a logic "1" level.

Consequently, because the scan data is multiplexed into the A-phase dynamic scan latch 122, over a path distinct from the path utilized by non-scan data, the amount of logical work that can be accomplished during the A-phase of the level 1 clock signal 50 is preserved. As a result, the A-phase dynamic scan latch 222 can be scanned and controlled while maintaining performance with respect to gate delay in the non-scan data path. Hence, scan control and observation circuitry can be added to clocked storage elements with minimal impact to area constraints of the clocked storage element in a VLSI design.

Figure 10:
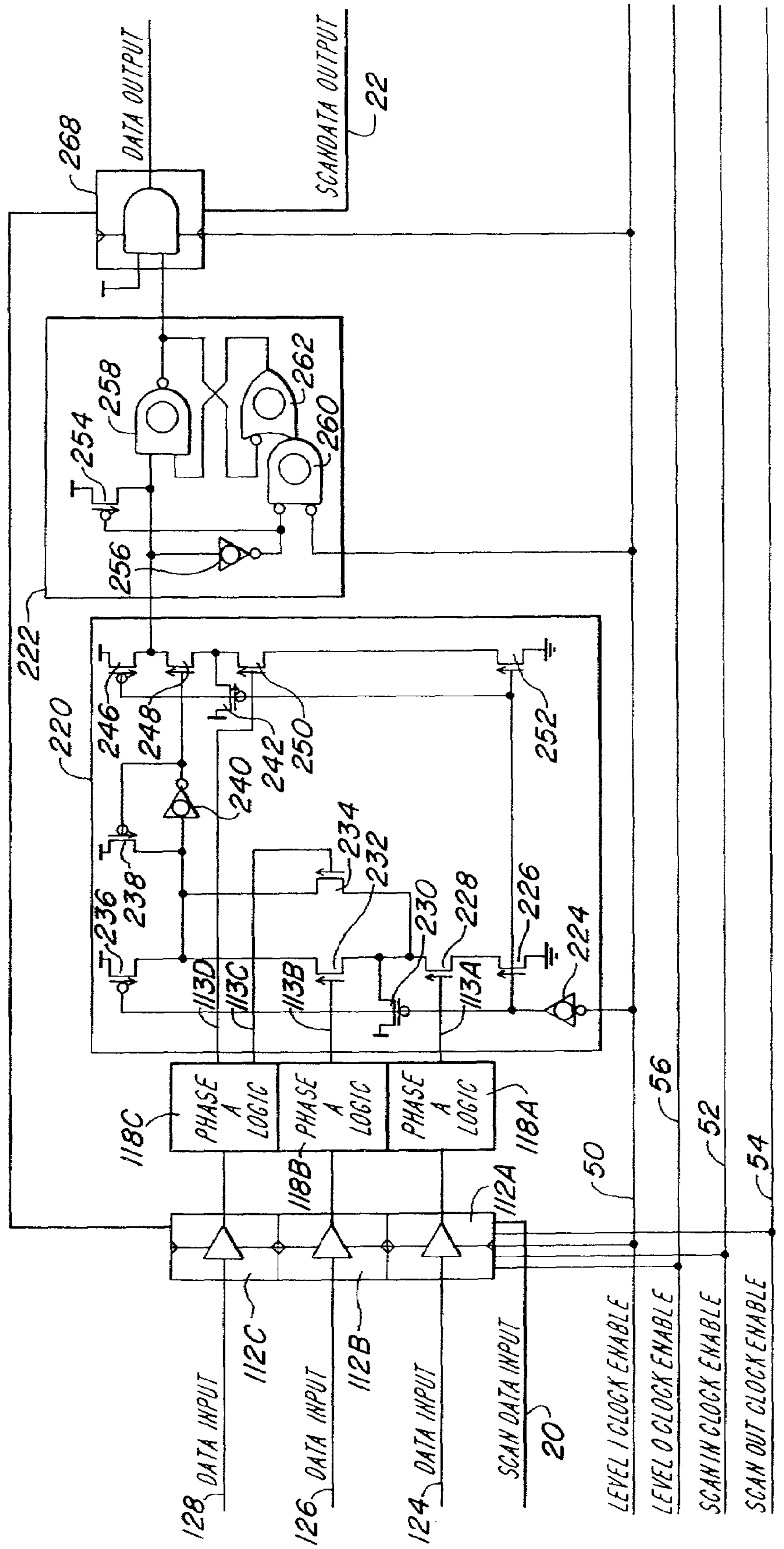
FIG. 10 is a circuit diagram of a B-Phase dynamic circuit suitable for use in the illustrative embodiment of the present invention.

FIG. 10 illustrates a B-phase logic circuit 220 and a B-phase latch 222 suitable for use with the exemplary system 10. Those skilled in the art will recognize that the B-phase circuit 220 and the B-phase latch 222 precharge their dynamic nodes during the A-phase of the level 1 clock signal 50 and evaluate their inputs when the level 1 clock signal 50 is in its B-phase. The B-phase latch 222 is not scannable, and the level 1 clock signal 50 never stops to allow the B-phase latch 222 to precharge and evaluate without interruption. Nevertheless, those skilled in the art will recognize that the exemplary system 10 can be configured so that the B-phase clocked storage elements are scanned and the A-phase clocked storage elements are not.

The scan data input node 20 is coupled to the scannable A-phase buffer latch 112A, the scannable A-phase buffer latch 112B, the scannable A-phase buffer latch 112C and to the scannable A-phase AND latch 268. The scan data output node 22 is coupled to the scannable A-phase AND latch 268. The scannable A-phase buffer latch 112A, 112B, 112C and the scannable A-phase AND latch 268 form an example of serial scan chain within the exemplary system 10. Those skilled in the art will recognize that one or more of the scannable A-phase latches can be substituted with scannable edge triggered devices such as a scannable flip-flop, which is discussed below in more detail with reference to FIG. 11.

The scannable A-phase buffer latch 112A is coupled to the data input node 124 and has its output coupled to the A-phase logic circuit 118A, which has its output node coupled to input node 113A of the B-phase domino circuit 220. In like manner, the A-phase scannable buffer latch 112B has its input coupled to the data input node 126 and its output drives the input of the A-phase logic circuit 118B, which, in turn drives the input node 113B of the B-phase domino logic circuit 220. The A-phase scannable buffer latch 112C has its input coupled to the data input node 128 and its output node coupled to the A-phase logic circuit 118C. The A-phase logic circuit 118C drives the B-phase domino circuit 220 with a first data value on input node 113C and a second data value on input node 113D. The A-phase scannable buffer latch 112A, 112B and 112C, along with the A-phase scannable AND latch 268 are coupled to the level 1 clock signal 50 to synchronize their logic events. In addition, the level 0 clock enable signal 56, the scan in clock signal 52 and the scan out clock signal 54 are coupled to the scannable A-phase buffer latch 112A, 112B and 112C, and the scannable A-phase AND latch 268 to synchronize scan and logic events so as to avoid commingling of scan data with non-scan data.

The B-phase domino circuit 220 is a four input logic circuit and its logical operation is controlled by the level 1 clock signal 50 coupled to the input of the inverter 224. The output of the B-phase domino circuit 220 is coupled to the input of the B-phase dynamic latch 222. The logical operation of the B-phase dynamic latch 222 is gated by the level 1 clock signal 50 coupled to an input of the NAND gate 260. The output of the B-phase dynamic latch 222 is coupled to a first input of the scannable A-phase AND latch 268. The second input of the scannable A-phase AND latch 268 is coupled to a voltage source supplying a high-level voltage signal. Nevertheless, one skilled in the art will recognize that the second input of the scannable A-phase AND latch 268 can be coupled to another clocked storage element or another B-phase logic circuit or may be tied to ground.

The B-phase domino circuit 220 precharges its dynamic nodes when the level 1 clock signal 50 is at a logic "1" level or its A-phase, and the B-phase domino circuit 220 evaluates the data on its input nodes, when the level 1 clock signal 50 is at a logic "0" level or in its B-phase. The B-phase domino circuit 220 has its first data input node 113A coupled to the gate of NMOS transistor 228, its second data input node 113B coupled to the gate of NMOS transistor 232, its third data input node 113C coupled to the gate of NMOS transistor 234 and its fourth data input node 113D coupled to the gate of NMOS transistor 250. One of ordinary skill in the art will recognize that the B-phase domino circuit can take the form of any circuit topology performing one or more logical operands. The data output node of the B-phase domino circuit 220 is coupled to the drain of the PMOS transistor 246 and the drain of NMOS transistor 248.

The output of the inverter 224 is coupled to the gate of NMOS transistor 226 and NMOS transistor 252. One of ordinary skill in the art will recognize that NMOS transistors 226 and 252 are commonly referred to as evaluate transistors. Hence, the NMOS transistor 226 controls evaluation of the first logic stage in the B-phase domino circuit 220, and the NMOS transistor 252 controls evaluation of the second logic stage in the B-phase domino circuit 220. The output of the inverter 224 is coupled to the gate of PMOS transistor 230 and the gate of PMOS transistor 236. The source of the PMOS transistors 230, 236, 238, 242 and 246 are coupled to a voltage source supplying a high-level voltage signal.

The PMOS transistor 238 in combination with the inverter 240 form a keeper circuit to help maintain state of the dynamic node formed by the drain of the PMOS transistor 236. The gate of PMOS transistor 238 is coupled to the output of the inverter 240 and the gate of NMOS transistor 248. The drain of the PMOS transistor 238 is coupled to the input of the inverter 240, the drain of NMOS transistor 232 and 234, along with the drain of PMOS transistor 236.

The drain of the PMOS transistor 230 is coupled to the source of NMOS transistor 232 and to the source of NMOS transistor 234 along with the drain of NMOS transistor 228. The source of the NMOS transistor 228 is coupled to the drain of NMOS transistor 226 which has its source coupled to ground. PMOS transistor 242 has its drain coupled to the source of NMOS transistor 248 and the drain of NMOS transistor 250. The source of NMOS transistor 250 is coupled to the drain of NMOS transistor 252 which has its source coupled to ground.

The B-phase domino circuit 220 performs a complex logical function on the data values received on its input nodes 113A, 113B, 113C and 113D during the B-phase of the level 1 clock signal 50. The value asserted at the input node 113B is logically ORed with the value asserted at the input node 113C and the result is logically NANDed with the data value on the input node 113A. The logical result from the first stage of the B-phase latch circuit is logically NANDed with the data value present on the input 113D and this result is asserted to the input of the B-phase latch circuit 222.

In more detail, during the precharge phase of the B-phase domino circuit 220 its output node is precharged to a logic "1" level. If during the evaluation phase the date value on the input node 113A is a logic "1" value and the data value on input node 113B or 113C or both is a logic "1" level the state of the dynamic node transitions from a logic "1" level to a logic "0" level. In turn, NMOS transistor 248 is enabled and if the data value on the input node 113D is a logic "1" level the output of the B-phase dynamic circuit 220 transitions from a logic "1" level to a logic "0" level.

The B-phase domino logic circuit 222 is configured so that the inverter 256 has its output coupled to the gate of PMOS transistor 254 and the second input of the NAND gate 260. The output of the NAND gate 260 is coupled to a first input of the OR gate 262. The output of the OR gate 262 is coupled to an input of NAND gate 258. The output of NAND gate 258 is coupled to the inverted input of OR gate 262 and to the output node of the B-phase dynamic latch 222. The second input of NAND gate 258 is coupled to the drain of PMOS transistor 254, the input to inverter 256 and the input to the B-phase dynamic latch 222. The source of the PMOS transistor 254 is coupled to a voltage source supplying a high-level voltage signal. One of ordinary skill in the art will recognize that the B-phase dynamic latch 222 can take its form in other circuit topologies without departing from the scope of the present invention.

The dynamic B-phase latch 222 operates in the following fashion. If during the start of the evaluate phase of the B-phase dynamic latch 222, the output of the B-phase dynamic latch 222 is at a logic "1" level, the output transitions to a logic "0" level. If during the evaluate phase of the B-phase dynamic latch 222 its input transitions from a logic "1" level to a logic "0" level, the output of the B-phase dynamic latch 222 rises to a logic "1" level; otherwise, the output of the B-phase dynamic latch 222 remains at a logic "0" level.

As configured, the B-phase domino logic circuit 220 and the B-phase dynamic latch 222 are able to precharge and evaluate without interruption even while scan testing is occurring in the scannable A-phase clocked storage elements depicted in FIG. 10. In this manner, performance of the VLSI design is not diminished, but enhanced. Consequently, scan control and observation can be implemented into a VLSI design, such as a microprocessor without having to significantly increase the number of components and correspondingly the area of the microprocessor itself.

Figure 11:
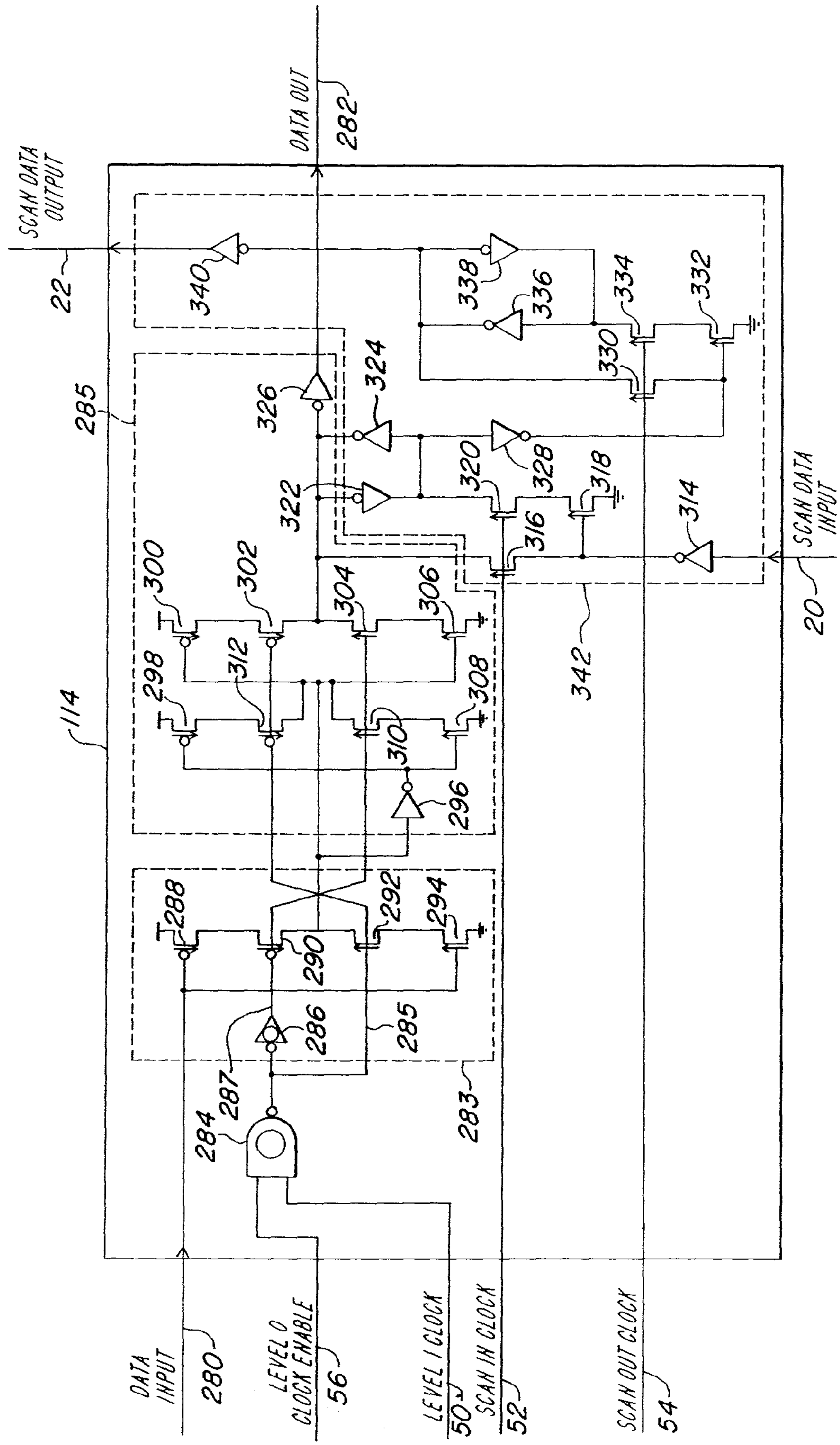
FIG. 11 is a schematic diagram of a flip-flop suitable for use in the illustrative embodiment of the present invention.

FIG. 11 depicts a scannable flip-flop 114 suitable for use in the exemplary system 10. As depicted, the scannable flip-flop 114 samples data on the input data node 280 within a period known as the aperture window around the assertion edge of the level 1 clock signal 50. It is during this period that the flip-flop 114 is considered transparent, that is, it updates its output node 282 with a new data value and advances its current state to the next state. At any other time, the flip-flop 114 is opaque and ignores any change on the data input node 280. The flip-flop 114 captures data on the data input node 280 on the positive edge of the level 1 clock signal 50, hence flip-flop 114 is positive edge triggered; one of ordinary skill in the art will recognize that a negative edge triggered flip-flop that samples data on the negative edge of the level 1 clock signal 50 can also be utilized given the need of the application.

The flip-flop 114 includes a slave circuit 285 coupled to a master circuit 283 and the scan circuit 342. The slave circuit 285 is a transparent low latch that is gated by the level 0 clock signal 287 and the inverted level 0 clock signal 285. The master circuit 283 is a transparent high latch clocked by the level 0 clock signal 287 and the inverted level 0 clock 285. The level 0 clock 285 and the inverted level 0 clock 287 are derived within the flip-flop 114 itself by gating the level 1 clock signal 50 with the level 0 clock enable signal 56 with the NAND gate 284.

In operation, when the level 0 clock signal 287 is at a logic "1" level the master circuit 283 is transparent and samples the change on the data input node 280. This change is ignored by the slave circuit 285 because at this time it is opaque. As a result, the slave circuit 285 holds the state of the data output node 282. When the level 0 clock enable signal 56 rises to a logic "1" level and the level 1 clock signal 50 rises to a "1" level, the master circuit 283 becomes opaque and holds its state. In turn, the slave circuit 285 becomes transparent and updates the data output node 282 by sampling its input coupled to the drain of PMOS transistor 290 and the drain of NMOS transistor 292. Although the slave circuit 285 remains transparent for as long as the level 0 clock 287 is at a logic "0" level, the data value asserted by the master circuit 283 does not change again. Hence, the data value on the data output node 282 is subject to being updated once per cycle of the level 1 clock signal 50. Detailed operation of the scan circuit 342 will be discussed below.

The master circuit 283 and the slave circuit 285 are triggered by the level 0 clock signal 287 asserted by the output of the inverter 286 and the inverted level 0 clock signal 285 asserted by the output of the NAND gate 284. The NAND gate 284 has a first input coupled to the level 0 clock enable signal 56 and a second input coupled to the level 1 clock signal 50. The output of the NAND gate 284 is coupled to the input of the inverter 286, the gate of NMOS transistor 292, the gate of PMOS transistor 312 and the gate of PMOS transistor 302. The output of the inverter 286 is coupled to the gate of PMOS transistor 290, the gate of NMOS transistor 310 and the gate of NMOS transistor 304.

The data input node 280 is coupled to the gate of the PMOS transistor 288 and the gate of NMOS transistor 294. The PMOS transistor 288 has its source coupled to a voltage source supplying a high-level voltage signal and its drain coupled to the source of PMOS transistor 290. The drain of PMOS transistor 290 is coupled to the drain of NMOS transistor 292, which has its source coupled to the drain of NMOS transistor 294. The source of NMOS transistor 294 is coupled to ground.

The drain of the PMOS transistor 290 and the drain of the NMOS transistor 292 form the output node of the master circuit 283 to drive the input of the slave circuit 285. The input of the slave circuit 285 is coupled to the input of inverter 296, to the drain of PMOS transistor 312, the drain of NMOS transistor 310, the gate of PMOS transistor 300 and the gate of NMOS transistor 306. The output of the inverter 296 is coupled to the gate of PMOS transistor 298 and the gate of NMOS transistor 308. The source of PMOS transistor 298 is coupled to a voltage source supplying a high-level voltage signal and the drain of the PMOS transistor 298 is coupled to the source of PMOS transistor 312. The source of NMOS transistor 310 is coupled to the drain of NMOS transistor 308, which has its source coupled to ground. The PMOS transistor 300 has its source coupled to a voltage source supplying a high-level voltage signal and its drain coupled to the source of PMOS transistor 302. The source of NMOS transistor 304 is coupled to the drain of NMOS transistor 306, which has its source coupled to ground. The drain of PMOS transistor 302 and NMOS transistor 304 drive the input of the inverter 326 along with the input of the inverter 322. The output of the inverter 326 is coupled to the data output node 282.

The input of the inverter 324 is coupled to the input of the inverter 328, the output of the inverter 322 and the drain of the NMOS transistor 320. The gate of NMOS transistor 320 along with the gate of NMOS transistor 316 is coupled to the scan in and clock signal 52. The source of NMOS transistor 320 is coupled to the drain of NMOS transistor 318. The gate of NMOS transistor 318 is coupled to the source of NMOS transistor 316 and the output of inverter 314. The source of NMOS transistor 318 is coupled to ground. The input of the inverter 314 is coupled to the scan data input node 20.

The scan out clock signal 54 is coupled to the gate of NMOS transistor 330 and the gate of NMOS transistor 334. The source of NMOS transistor 330 is coupled to the output of the inverter 328 and the gate of the NMOS transistor 332. The source of the NMOS transistor 332 is coupled to ground while its drain is coupled to the source of NMOS transistor 334. The drain of the NMOS transistor 334 is coupled to the input of the inverter 336 and the output of the inverter 338. The drain of the NMOS transistor 330 is coupled to the output of the inverter 336, the input of the inverter 338 and the input of the inverter 340. The output of the inverter 340 is coupled to the scan data output node 22.

With reference to FIG. 4, scan data on the scan data input node 20 is shifted into the scan circuit 342 on the rising edge of the scan in clock signal 52, which is in phase with the rising edge of the level 1 clock signal 50. Those skilled in the art will recognize that the level 1 clock signal 50 is not required to shift scan data into the scan circuit 342. While the scan data is being shifted into the scan circuit 342, the level 0 clock enable signal 56 remains deasserted at a logic "0" level. While the scan in clock signal 52 is at a logic "1" level the NMOS transistor 316 and the NMOS transistor 320 are enabled. If the scan data value on the scan data input node 20 is a logic "0" value the NMOS transistor 318 is enabled and allows the NMOS transistor 316 to drive the output node formed by the drain of NMOS transistor 304 and the drain of PMOS transistor 302 to a logic "1" level, which results in a logic "0" level on the data output node 282. The inverter pair 322 and 324 forms a latch on the output node of the slave circuit 285 to maintain the logic state. As a result, the NMOS transistor 332 is enabled and the source of the NMOS transistor 330 is charged to a logic "1" level.

Consequently, when the level 0 clock enable signal 56 is asserted to a logic "1" level the slave circuit 285 asserts the state of the master circuit 283. If the master circuit 283 was holding a logic "0" level the slave circuit 285 asserts at its output node formed by the drain of PMOS transistor 302 and NMOS transistor 304 a logic "1" level, which, in turn, is inverted by the inverter 326 and asserted on the data output node 282 as a logic "1" data value. In this instance, following the return of the level 0 clock enable signal 56 to a logic "0" level and the assertion of the scan out clock signal 54 to a logic "1" level, the NMOS transistor 330 and the NMOS transistor 334 are enabled. Consequently, based on the logic "0" level being held at the output node formed by the drain of the PMOS transistor 302 and the drain of NMOS transistor 304 the scan data output node 22 asserts a logic 1 value. In the instance where the output node formed by the drain of PMOS transistor 302 and the drain of NMOS transistor 304 is at a logic "1" level following the deassertion of the level 0 clock enable signal 56, and the assertion of the scan out clock signal 54 to a logic "1" level, the scan circuit 342 asserts on the scan data output node 22 a logic "1" value.

Figure 12:
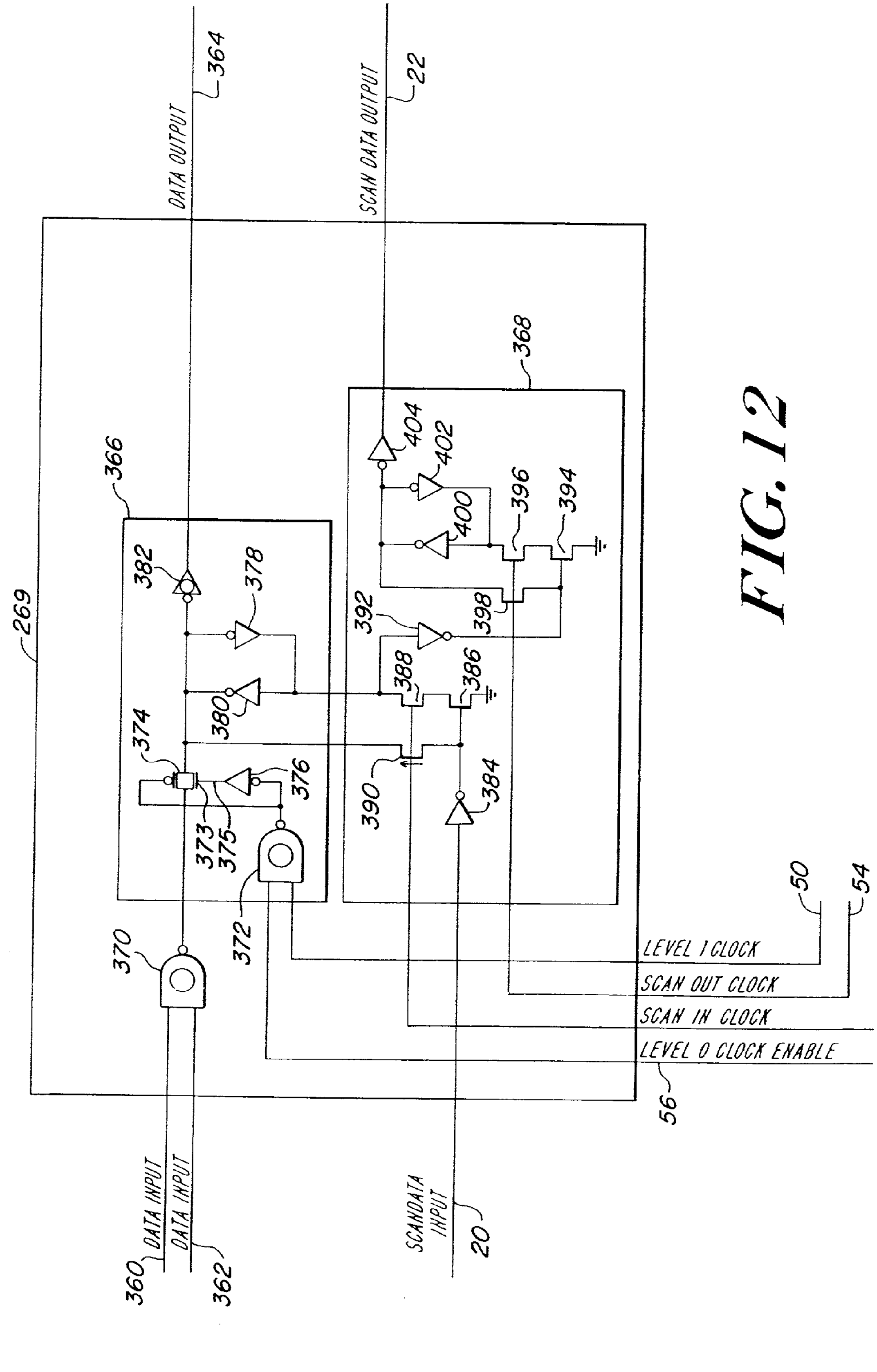
FIG. 12 is a schematic diagram of a scannable latch suitable for use in the illustrative embodiment of the present invention.

FIG. 12 illustrates a scannable A-Phase NAND latch 269 suitable for use in the exemplary system 10. The scannable A-phase NAND latch 269 is configured to include a NAND gate 370 which performs a logic NAND operation on the data asserted on the data input node 360 and 362. The NAND gate 370 drives the A-phase buffer latch circuit 366 with the results of its logical operand. The A-phase buffer latch circuit 366 is coupled to the scan circuit 368 to allow scan observation and control to occur during the A-phase of the level 1 clock signal 50. Those skilled in the art will recognize that the NAND gate 370 can be substituted with other logical operands, such as an AND, NOR, OR, or other logical operand.

The A-phase buffer latch circuit 366 includes the NAND gate 372 that has one input coupled to the level 0 clock enable signal 56 and the other input coupled to the level 1 clock signal 50. The output of the NAND gate 372 is coupled to the input of inverter 376 and the gate of the PMOS transistor 374. The output of the inverter 376 is coupled to the gate of the NMOS transistor 373. Those skilled in the art will recognize that the transistor combination of PMOS transistor 374 and NMOS transistor 373 form what is known in the art as a transmission gate.

PMOS transistor 374 and NMOS transistor 373 are coupled in parallel so that the source of the PMOS transistor 374 is coupled to the source of the NMOS transistor 373 while the drain of PMOS transistor 374 is coupled to the drain of NMOS transistor 373 and coupled to the input of the inverter 382, the input to the inverter 378, the output of the inverter 380 and the drain of NMOS transistor 390. The input of inverter 380 is coupled to the output of the inverter 378 and is coupled to the input of the inverter 392 and the drain of NMOS transistor 388. The output of the inverter 382 is coupled to the data output node 364. The cross coupled inverter 380 and inverter 378 operate to hold the drain of the PMOS transistor 374 and the drain of NMOS transistor 373 at a known state.

The scan circuit 368 is configured so that the scan data input node 20 is coupled to the input of the inverter 384 which has its output coupled to the gate of NMOS transistor 386 and the source of NMOS transistor 390. The scan in clock signal 52 is coupled to the gate of NMOS transistor 390 and the gate of NMOS transistor 388. The scan out clock signal 54 is coupled to the gate of NMOS transistor 398 and the gate of NMOS transistor 396. The source of NMOS transistor 386 is coupled to ground while its drain is coupled to the source of NMOS transistor 388. The output of the inverter 392 is coupled to the gate of NMOS transistor 394 and the source of NMOS transistor 398. The source of NMOS transistor 394 is coupled to ground while its drain is coupled to the source of NMOS transistor 396. The drain of NMOS transistor 398 is coupled to the input of the inverter 404, the input of the inverter 402 and the output of the inverter 400. The input of the inverter 400 is coupled to the output of the inverter 402 and to the drain of the NMOS transistor 396. The output of the inverter 404 is coupled to the scan data output node 22.

In operation, so long as the level 0 clock enable signal 56 remains deasserted at a logic "0" level, the scannable A-phase NAND latch 269 is opaque and no data passes from the input nodes 360 and 362 to the data output node 364. The A-phase buffer latch 366 becomes transparent when the level 1 clock signal 50 and the level 0 clock enable signal 56 are both at a logic "1" level. Consequently, the A-phase buffer circuit 366 passes the data asserted by the NAND gate 370 to the data output node 364 when the level 0 clock enable signal 56 and the level 1 clock signal 50 are both at a logic "1" level. However, when the level 0 clock enable signal 56 is deasserted to a logic "0", the A-phase buffer latch circuit 366 ignores the logical value asserted by the NAND gate 370 and holds the most recent input value sampled at the time when the level 0 clock enable signal 56 and the level 1 clock signal 50 were both at a logic "1" level. Nevertheless, those skilled in the art will recognize that the A-phase buffer latch 366 can be configured to be transparent when the level 1 clock signal 50 is at a logic "0" level.

So long as the level 0 clock enable signal 56 is deasserted, that is, at a logic "0" level, the normal logic data path through the A-phase buffer circuit 366 is blocked thus enabling the scan data path through the scan circuit 368. Hence, when the scan in clock signal 52 is asserted to a logic "1" level the NMOS transistor 390 and NMOS transistor 388 are enabled. If the scan data asserted at the scan data input node 20 is at a logic "0" level the NMOS transistor 386 is also enabled. As a result, the value of the data being held at the drain of PMOS transistor 374 and NMOS transistor 373 is driven to a logic "1" level, which, in turn, enables the NMOS transistor 394. When the scan out clock signal 54 is asserted to a logic "1" level the NMOS transistor 398 and NMOS transistor 396 are enabled. Thus, the NMOS transistor 398 passes a logic "1" data value to the input of the inverter 404 which asserts a logic "0" data value on the scan data output node 22. Those skilled in the art will recognize that if the data value asserted at the scan data input node 20 is at a logic "1" level at the initiation of scan evaluation, the scan circuit 368 asserts a logic "1" data value on the scan data output node 22 at the completion of the scan evaluation so long as the A-phase scan latch 268 is functioning as designed.

While the present invention has been described with reference to a preferred embodiment thereof, one skilled in the art will appreciate that various changes in form and detail may be made without departing from the intended scope of the present invention as defined in the pending claims. For example, the exemplary system 10 can be configured so that the B-phase circuits can be scanned while the A-phase circuits are not and that dynamic circuits which operate in either phase, that is A or B, can also be scanned. Moreover, the logic "0" level referred to throughout this text refers to a voltage level that is approximately 0 volts and the logic "1" level referred to throughout this text refers to a voltage level that is at least approximately 1.0 volts.

What is claimed is:

1. A system for performance of scan control and observation on a circuit of said system, said system having a system clock that runs without interruption to synchronize said scan control and observation of said circuit with logical operation of said circuit, said system comprising:

a clock control circuit synchronized by said system clock to control when said scan control and observation of said circuit occurs, wherein said system clock synchronizes one or more clock signals asserted by said clock control circuit, and a system controller to control operation of said clock control circuit, wherein said system controller provides said clock control circuit with a plurality of control signals for said performance of said scan control and observation of said circuit.

2. The system of claim 1 wherein said clock control circuit comprises;

a first clock generator circuit to generate a first clock signal synchronous to said system clock, wherein said first clock signal provides said circuit with a clock stimulus to allow said circuit to operate;

a second clock generator circuit to generate a second clock signal synchronous to said system clock, wherein said second clock signal shifts scan data into said circuit for said performance of said scan control and observation;

a third clock generator circuit to generate a third clock signal synchronous to said system clock, wherein said third clock signal shifts said scan data out of said circuit; and a control circuit to control when said first clock generator circuit, said second clock generator circuit and said third clock generator circuit each generate their respective clock signal.

3. The system of claim 2, wherein said first clock generator circuit comprises, a latch to generate a time dependent signal synchronous to said system clock;

an output circuit; and a buffer circuit to drive said output circuit with said time dependant signal from said latch, wherein said output circuit gates said time dependent signal with said system clock to produce said first clock signal.

4. The system of claim 3, wherein said system controller disables said first clock generator to halt activity in said circuit.

5. The system of claim 3, wherein said output circuit comprises, one or more NAND gates to gate said time dependent signal and said system clock; and one or more buffer elements to buffer each output of said one or more NAND gates.

6. The system of claim 2, wherein said second clock generator circuit comprises, a latch to generate a time dependent signal synchronous with said system clock;

an output circuit; and a buffer circuit to drive to said output circuit with said time dependent signal from said latch, wherein said output circuit gates said time dependent signal and said system clock to produce said second clock signal.

7. The system of claim 6, wherein said output circuit comprise, one or more NAND gates to gate said time dependent signal and said system clock; and one or more buffer elements to buffer each output of said one or more NAND gates.

8. The system of claim 2, wherein said third clock generator circuit comprises, a latch to generate a time dependent signal synchronous with said system clock;

an output circuit;

a buffer circuit to drive said output circuit with said time dependent signal from said latch, wherein said output circuit gates said system clock and said time dependant signal to produce a gated signal; and an output buffer circuit to buffer said gated signal of said output circuit to assert said third clock signal, wherein said output buffer circuit prevents phase overlap of said second clock signal and said third clock signal.

9. The system of claim 8, wherein said output circuit comprises, one or more NOR gates to gate said time dependent signal and said system clock; and one or more buffer elements to buffer each output of said one or more NOR gates.

10. The system of claim 2, wherein said control circuit further provides said circuit with an enable signal to control when said circuit evaluates said scan data.

11. The system of claim 1, wherein said circuit comprises a level sensitive logic element.

12. The system of claim 11, wherein said level sensitive logic element comprises a latch.

13. The system of claim 1, wherein said circuit comprises an edge triggered logic element.

14. The system of claim 13, wherein said edge triggered logic element comprises a flip-flop.

15. The system of claim 1, wherein said system is capable of performing scan control and observation on a dynamic logic circuit that functions based on a rising edge of one of the clock signals asserted by the clock control circuit.

16. The system of claim 1, wherein said system is capable of performing scan control and observation on a dynamic logic circuit that functions based on a falling edge of one of the clock signals asserted by the clock control circuit.

17. A method for scan control and observation of an integrated circuit having a scannable circuit, said method comprising the steps of:

generating a system clock for said integrated circuit that runs continually during said scan control end observation of said scannable circuit; and controlling operation of said integrated circuit in synchronicity with said system clock to determine an internal state of said scannable circuit of said integrated circuit.

18. The method of claim 17, wherein said step of controlling said integrated circuit comprises the steps of:

generating a first clock signal to control logical operation of said scannable circuit;

generating a second clock signal to allow scan data to propagate into said scannable circuit;

generating a third clock signal to allow said scannable circuit to assert said scan data for said determination of said internal state of said scannable circuit; and controlling a control signal that allows said scannable circuit to enter a scan state to evaluate said scan data.

19. The method of claim 18, further comprising the step of halting said generation of said first clock signal to cease said logical operation in said scannable circuit.

20. The method of claim 18, further comprising the steps of;

halting generation of said second clock signal; and halting generation of said third clock signal, wherein said halting generation of said second clock signal and said halting generation of said third clock signal prevents said scannable circuit from evaluating scan data without disabling logical operation of said scannable circuit.

21. The method of claim 18, further comprising the step of, controlling an enable signal coupled to said scannable circuit to control when said scannable circuit evaluates scan data and when said scannable circuit evaluates non-scan data.

22. The method of claim 17, wherein said scannable circuit comprises a level sensitive circuit.

23. The method of claim 22, wherein said level sensitive circuit comprises a latch.

24. The method of claim 17, wherein said scannable circuit comprises an edge triggered circuit.

25. The method of claim 24, wherein said edge triggered circuit comprises a flip-flop.

26. An integrated circuit comprising, a scannable logic element;

a clock circuit coupled to a system clock that runs continuously to synchronize operation of said clock circuit; and a control circuit to control operation of said clock circuit, wherein said control circuit provides said clock circuit with control signals to control operation of said scannable logic element.

27. The integrated circuit of claim 26, wherein said clock circuit comprises, a control circuit; and a plurality of clock generation circuits to generate a plurality of clock signals synchronous to said system clock, wherein said control circuit controls when each of said plurality of clock generation circuits generate their respective clock signal.

28. The integrated circuit of claim 27, wherein a control signal of said control circuit coupled to said scannable logic element controls propagation of scan data and non-scan data within said scannable logic element.

29. The integrated circuit of claim 27, wherein said plurality of clock generation circuits comprises, a first clock generation circuit to generate a first of said plurality of clock signals, wherein said first of said plurality of clock signals allows said scannable logic element to logically operate;

a second clock generation circuit to generate a second of said plurality of clock signals, wherein said second of said plurality of clock signals clocks scan data into said scannable logic element; and a third clock generation circuit to generate a third of said plurality of clock signals, wherein said third of said plurality of clock signals clocks scan data out of said scannable logic element.

30. The integrated circuit of claim 26, wherein said integrated circuit comprises a very large scale integration (VLSI) circuit.

31. The integrated circuit of claim 30, wherein said very large scale integration circuit comprises a microprocessor.

32. The integrated circuit of claim 26, wherein said scannable logic element comprises a clocked storage element.

33. The integrated circuit of claim 32, wherein said clocked storage element comprises a level sensitive latch.

34. The integrated circuit of claim 32, wherein said clocked storage element comprises an edge triggered flip-flop.

* * * * *